United States Patent
Hrehor, Jr. et al.

(10) Patent No.: US 7,907,398 B2
(45) Date of Patent: Mar. 15, 2011

(54) LIQUID COOLING SYSTEM

(75) Inventors: Robert D. Hrehor, Jr., Round Rock, TX (US); Travis North, Pflugerville, TX (US); Kevin M. Bailey, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 12/243,990

(22) Filed: Oct. 2, 2008

(65) Prior Publication Data

US 2010/0085712 A1   Apr. 8, 2010

(51) Int. Cl.
*G06F 1/20* (2006.01)
*H05K 7/20* (2006.01)

(52) U.S. Cl. ......... 361/679.53; 361/679.47; 361/679.54; 361/699; 361/704; 361/716; 361/721; 165/80.4; 165/104.33; 165/185

(58) Field of Classification Search .................. 361/679, 361/46, 679.52–679.54, 699–704, 709–710, 361/715–716, 720–721, 679.47; 165/780, 165/3, 104.33, 185, 80.3, 80.4; 174/16.3
See application file for complete search history.

(56) References Cited

U.S. PATENT DOCUMENTS

| 6,252,771 | B1 * | 6/2001 | Jordan | 361/704 |
|---|---|---|---|---|
| 6,349,035 | B1 * | 2/2002 | Koenen | 361/719 |
| 7,106,595 | B2 * | 9/2006 | Foster et al. | 361/721 |
| 7,149,087 | B2 | 12/2006 | Wilson et al. | |
| 7,151,668 | B1 * | 12/2006 | Stathakis | 361/700 |
| 7,167,366 | B2 * | 1/2007 | Cheon | 361/699 |
| 7,286,355 | B2 * | 10/2007 | Cheon | 361/699 |
| 7,289,327 | B2 * | 10/2007 | Goodwin et al. | 361/701 |
| 7,408,776 | B2 * | 8/2008 | Campbell et al. | 361/699 |
| 7,639,498 | B2 * | 12/2009 | Campbell et al. | 361/699 |
| 7,643,300 | B1 * | 1/2010 | Zheng et al. | 361/716 |
| 7,679,913 | B2 * | 3/2010 | Hsieh | 361/704 |
| 7,738,252 | B2 * | 6/2010 | Schuette et al. | 361/704 |
| 2006/0098409 | A1 * | 5/2006 | Cheon | 361/699 |
| 2006/0250772 | A1 * | 11/2006 | Salmonson et al. | 361/698 |
| 2008/0062652 | A1 * | 3/2008 | Lieberman et al. | 361/715 |
| 2008/0259567 | A1 * | 10/2008 | Campbell et al. | 361/699 |
| 2008/0278916 | A1 * | 11/2008 | Hsieh | 361/711 |
| 2009/0002951 | A1 * | 1/2009 | Legen et al. | 361/715 |
| 2009/0080151 | A1 * | 3/2009 | Kalms et al. | 361/679.52 |
| 2009/0190303 | A1 * | 7/2009 | Chu et al. | 361/679.47 |

(Continued)

FOREIGN PATENT DOCUMENTS

JP   63192256 A  *  8/1988

(Continued)

OTHER PUBLICATIONS

English Translation of TW M323643.*

(Continued)

*Primary Examiner* — Robert J Hoffberg
(74) *Attorney, Agent, or Firm* — Haynes and Boone, LLP

(57) ABSTRACT

A liquid cooling system includes a board and a plurality of heat producing components (HPCs) coupled to the board. A mounting structure is located on the board adjacent to the plurality of HPCs. A liquid cooling device is coupled to the mounting structure such that the liquid cooling device engages each of the plurality of HPCs. The liquid cooling device may be decoupled from the mounting structure without detaching liquid conduits that supply it liquid in order to allow for the addition or removal of HPCs.

16 Claims, 24 Drawing Sheets

U.S. PATENT DOCUMENTS

| | | | |
|---|---|---|---|
| 2009/0219687 A1* | 9/2009 | Lin | 361/695 |
| 2009/0277616 A1* | 11/2009 | Cipolla et al. | 165/104.33 |
| 2009/0310295 A1* | 12/2009 | Chou et al. | 361/679.48 |
| 2010/0025010 A1* | 2/2010 | Cipolla et al. | 165/47 |
| 2010/0188817 A1* | 7/2010 | Chou et al. | 361/697 |

FOREIGN PATENT DOCUMENTS

| | | | |
|---|---|---|---|
| JP | 2010040886 A | * | 2/2010 |
| TW | 323643 | * | 12/2007 |
| TW | 328024 U | * | 3/2008 |

OTHER PUBLICATIONS http://techreport.com/articles.x/11273.

PC Powerzone—Serving Power Users since 2001—American owned & operated—No off-shore outsourcing, 4 pages, http://pcpowerzone.com/kora.html.

Liquid Cooled DDR2 VLP Registered DIMMS, 1 page, SMART Modular Technologies, www.smartm.com.

Uncommon Liquid-Cooling Mods, CPU, Computer Power User, 2 pages, http://www.computerpoweruser.com/editorial/article.asp?article=articles/archive/c0801/25c01/25c01.asp.

* cited by examiner

| Changing parameters | | 8 DIMMS | | |
|---|---|---|---|---|
| | | 800 rpm | 1500 rpm | 3150 rpm |
| | Application | Bench Mock-up | Bench Mock-up | Bench Mock-up |
| | DRAM Temp | 59.49026 | 48.5255714 | 43.7003952 |
| | Power | 19.24257 | 19.31098 | 19.1843429 |
| | Ambient | 25.28123 | 22.3983476 | 22.2285857 |
| | °C/W | 1.77777864 | 1.35297238 | 1.11923612 |
| | Fluid Temp | 42.682 | 30.7478667 | 25.8633762 |
| | °C/W Coldplate | 0.873493510 | 0.92060081 | 0.92976961 |

LIQUID COOLING SYSTEM

BACKGROUND

The present disclosure relates generally to information handling systems, and more particularly to a liquid cooling system for an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs such as, for example, desktops and servers, typically include a variety of heat producing components (HPCs) such as, for example, central processing units (CPUs), graphical processing units (GPUs), memory modules (e.g., Synchronous Dynamic Random Access Memory (SDRAM) such as Dual In-line Memory Modules (DIMMs)), and or a variety of other HPCs known in the art. As the processing speed of IHSs increases, the heat produced by the HPCs also increases. The cooling of these HPCs raises a number of issues. Traditionally, HPCs have been cooled by forcing air through heat dissipation devices that are coupled to the HPCs (e.g. heat sinks, heat pipes, and/or a variety of other heat dissipation devices known in the art). However, as the heat produced by the HPCs becomes greater and greater, these air convection systems begin to reach their limits of application due to, for example, noise and efficiency considerations. Furthermore, such air convection systems also limit the design and construction of IHS chassis with respect to the positioning and spacing of the HPCs, while limiting the ability to locate multiple HPCs in close proximity to one another due to the constriction in airflow and limited efficiency of forced air convection cooling.

One solution to these issues is to use liquid to cool the HPCs. Typically, a cold plate is coupled directly to each HPC and liquid is run through each cold plate to cool the HPCs. However, because of space issues in the IHS chassis, the conduits that provide the liquid to the cold plates and the passageways in the cold plates themselves must be relatively small, which then requires larger pumps to compensate for the large pressure drops that are created in order to move enough liquid to provide proper cooling. Furthermore, such solutions are cumbersome to install and remove in order to, for example, replace or upgrade the HPC.

Accordingly, it would be desirable to provide improved cooling for HPCs in an IHS.

SUMMARY

According to one embodiment, a liquid cooling system comprises a board, a plurality of HPCs coupled to the board, a mounting structure located on the board adjacent to the HPCs, and a liquid cooling device coupled to the mounting structure such that the liquid cooling device engages each of the plurality of HPCs.

BRIEF DESCRIPTION OF THE DRAWINGS

FIG. 2b is a perspective view illustrating an embodiment the HPC of FIG. 2a.

FIG. 5b is a bottom perspective view illustrating an embodiment of the liquid cooling device of FIG. 5a.

FIG. 5c is a disassembled perspective view illustrating an alternate embodiment of the liquid cooling device of FIG. 5a.

FIG. 10b is a perspective view illustrating an embodiment of the liquid cooling device of FIG. 9 coupled to the mounting structure and HPCs of FIG. 10a.

FIG. 13b is an assembled perspective view of the board, the HPC, the mounting structure, the stiffening member, and the liquid cooling device of FIG. 13a.

FIG. 14 is a table illustrating an experimental embodiment performed using a liquid cooling system according to the present disclosure.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a CPU or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
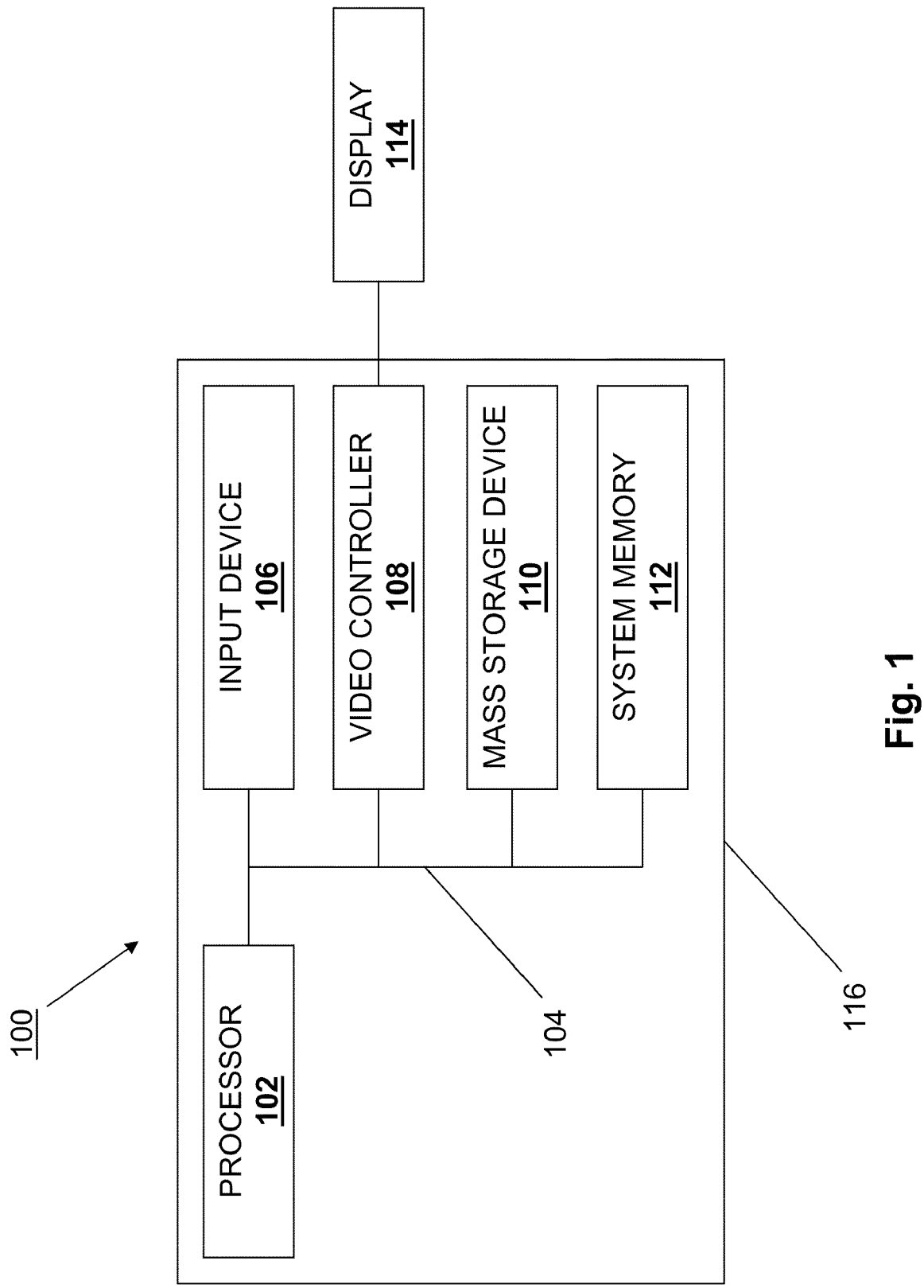
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. IHS 100 also includes a display 114, which is coupled to processor 102 by a video controller 108. Programs and data are stored on a mass storage device 110, which is coupled to processor 102. Examples of mass storage devices may include hard discs, optical disks, magneto-optical discs, solid-state storage devices, and/or a variety other mass storage devices known in the art. A system memory 112 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
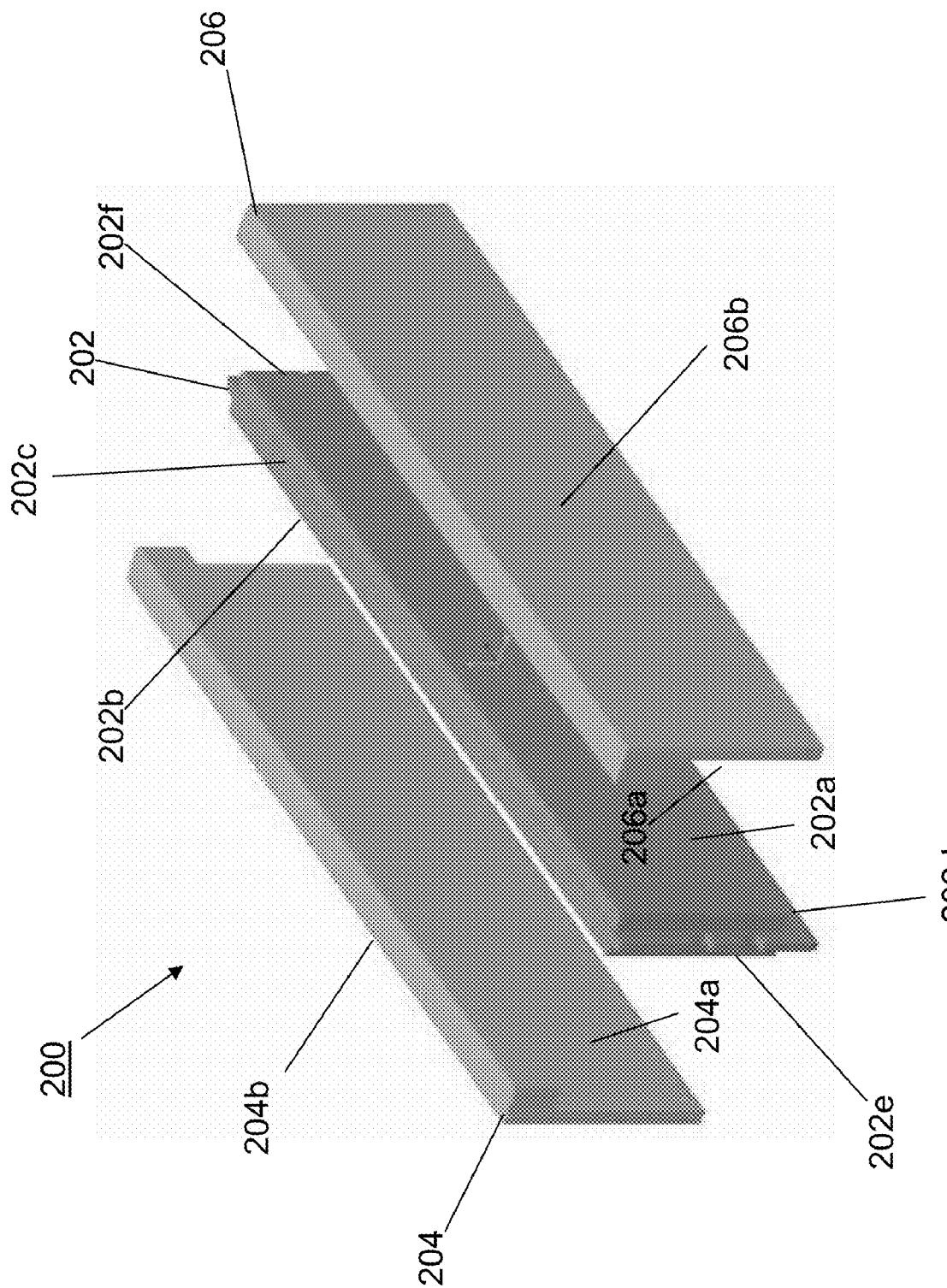
FIG. 2a is an exploded perspective view illustrating an embodiment of a HPC.

Referring now to FIG. 2a, a heat producing component 200 is illustrated. In the illustrated embodiment, the heat producing component 200 includes a memory device 202 having opposing a front surface 202a, a rear surface 202b located opposite the front surface 202a, a top edge 202c extending between the front surface 202a and the rear surface 202b, a bottom edge 202d located opposite the top edge 202c and extending between the front surface 202a and the rear surface 202b, and a pair of opposing side edges 202e and 202f extending between the front surface 202, the rear surface 202b, the top edge 202c, and the bottom edge 202d. In an embodiment, the memory device 202 is an SDRAM device such as, for example, a DIMM, which is a memory device known in the art to generate significant heat and for which effective cooling is critical to component reliability and performance. While the HPC 200 has been illustrated as a memory device, the HPC 200 may include a variety of heat producing IHS components known in the art. In an embodiment, the memory device 202 is a dual sided DIMM, and a plurality of heat spreaders 204 and 206 may be coupled to the front surface 202a and the rear surface 202b of the memory device 202 in order to efficiently conduct heat away from the memory device 202. Each heat spreader 204 and 206 includes a component engagement surface 204a and 206a, respectively, and an outer surface 204b and 206b, respectively, located opposite the respective component engagement surface 204 and 206a.

Figure 2B:
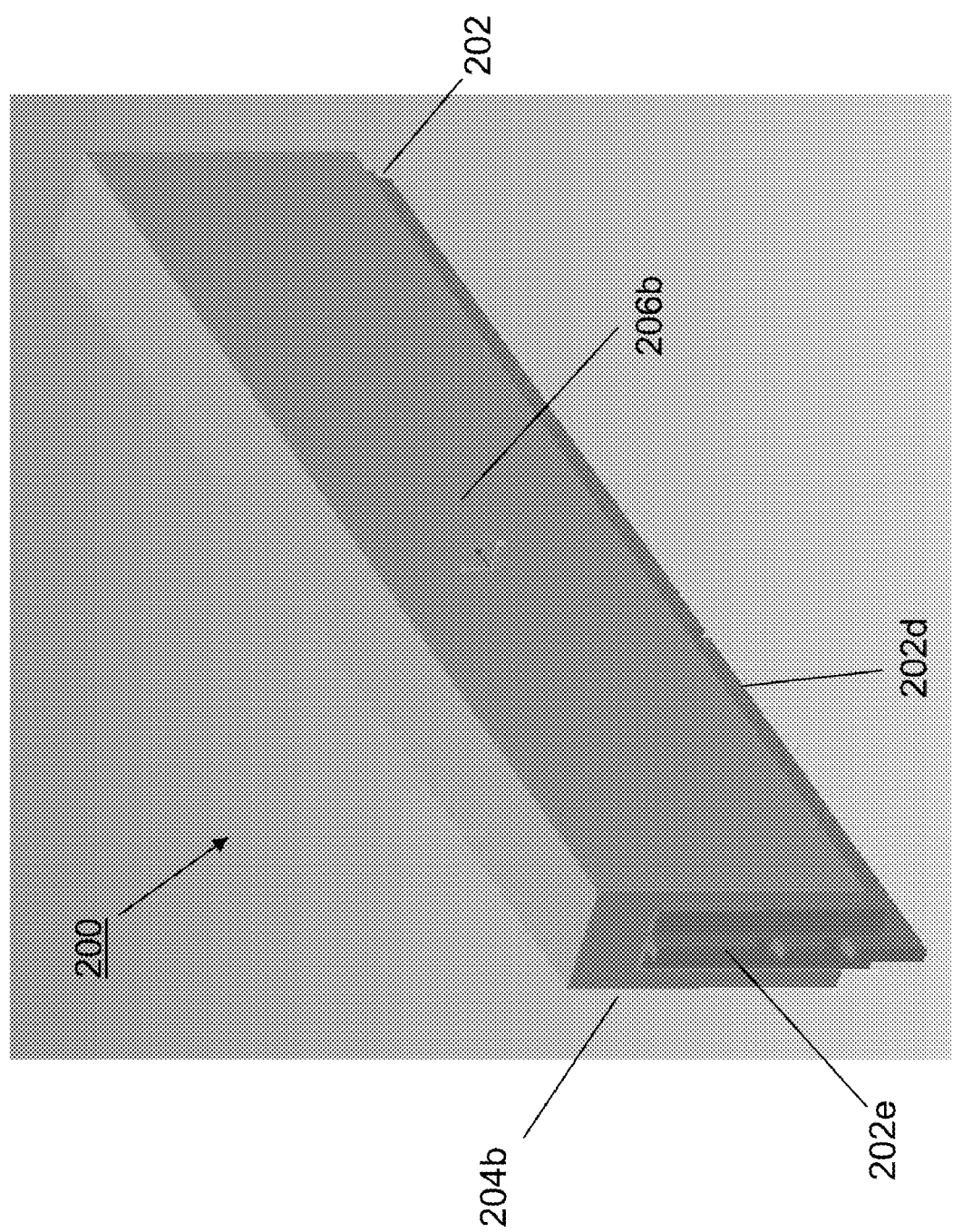
Figure 2C:
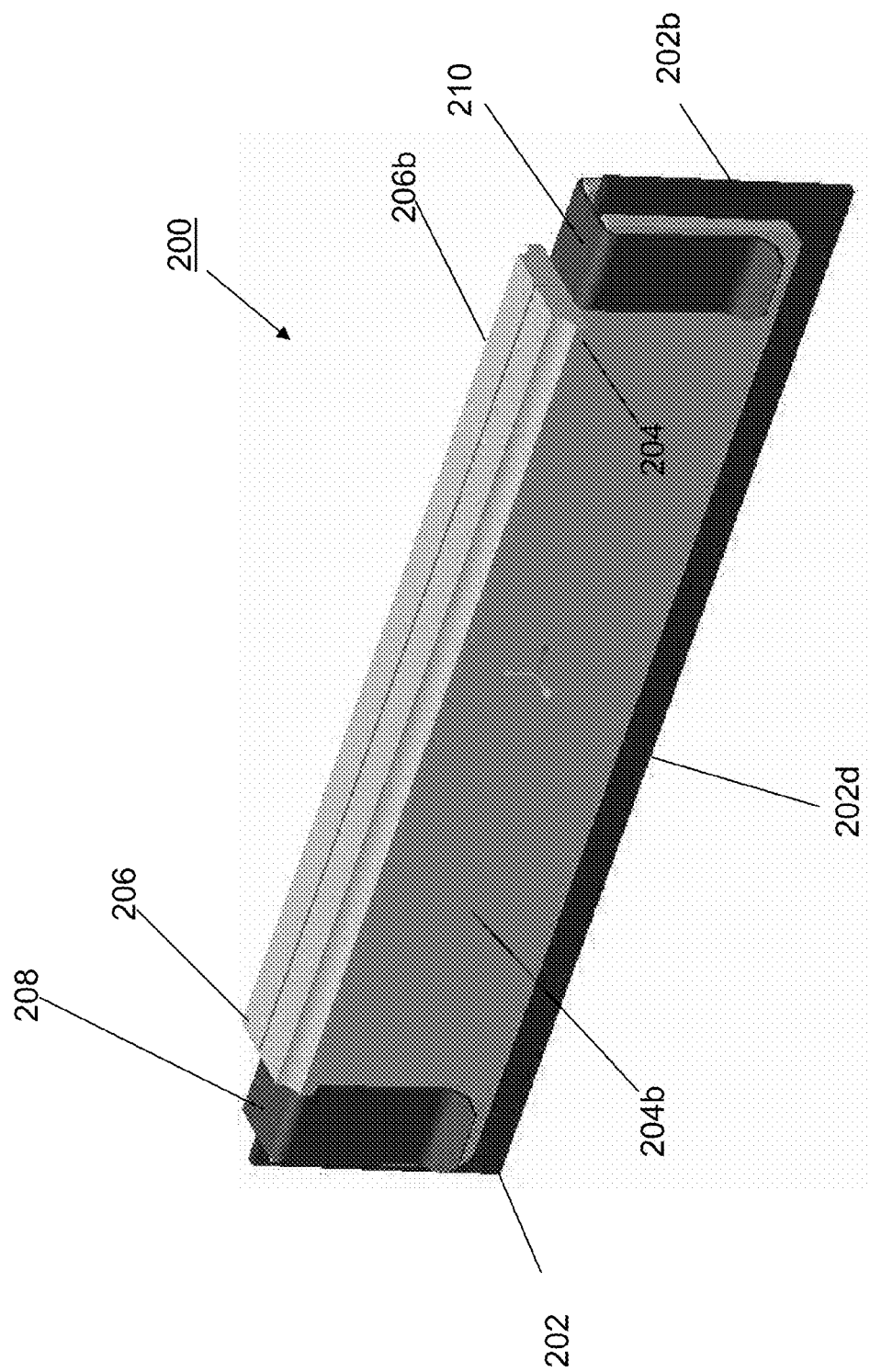
FIG. 2c is a perspective view illustrating an embodiment of the HPC of FIGS. 2a and 2b.

Referring now to FIGS. 2a, 2b and 2c, the coupling of the heat spreaders 204 and 206 with the memory device 202 is illustrated. The memory device 202 is positioned between the heat spreaders 204 and 206 such that the front surface 202a of the memory device 202 is located adjacent the component engagement surface 206a on the heat spreader 206 and the rear surface 202b of the memory device 202 is located adjacent the component engagement surface 204a on the heat spreader 204, as illustrated in FIG. 2a. The heat spreaders 204 and 206 are then coupled to the HPC 202 with the component engagement surfaces 206a and 204a engaging the front surface 202a and the rear surface 202b, respectively, of the HPC 202, as illustrated in FIG. 2b. In an embodiment, a thermal interface material may be positioned between the memory device 202 and either or both of the heat spreaders 204 and 206 in order to, for example, provide bonding strength to secure the heat spreaders 204 and 206 to the memory device 202 and/or facilitate heat transfer from the memory device 202 and the heat spreaders 204 and 206. In an embodiment, a plurality of retaining clips 208 and 210 may be used to secure the heat spreaders 204 and 206 to the memory device 202 by, for example, positioning the retaining clips 208 and 210 over the heat spreaders 204 and 206 such that they engage their outer surfaces 204b and 206b, as illustrated in FIG. 2c. While the HPCs 200 have been illustrated as memory devices with heat spreaders, one of skill in the art will recognize that the heat spreaders may be omitted or combined with other components of the system, described below, and the memory device 202 may be replaced by a variety of other HPCs known in the art.

Figure 3:
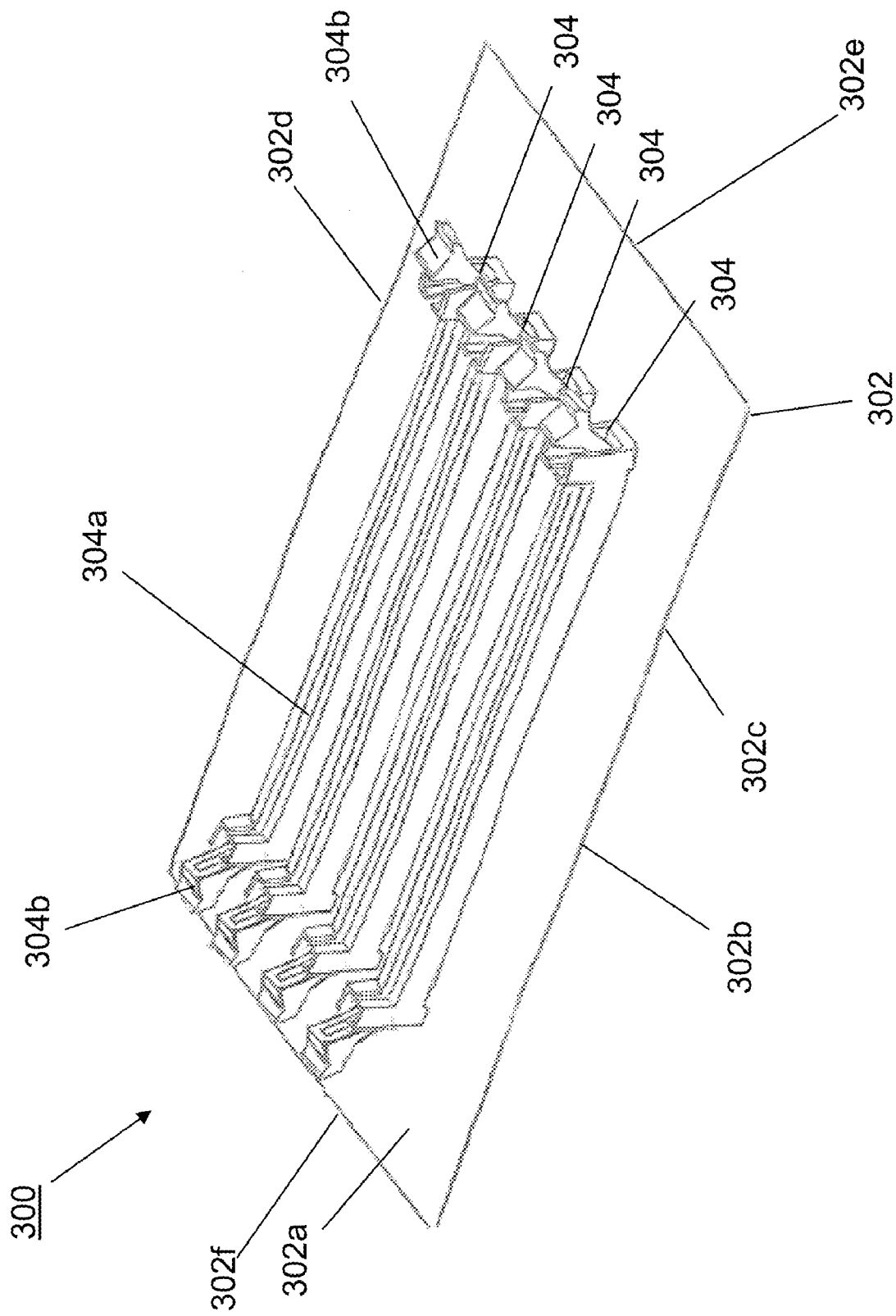
FIG. 3 is a perspective view illustrating an embodiment of a board used with the HPC of FIGS. 2a, 2b and 2c.

Referring now to FIG. 3, a board 300 is illustrated. The board 300 includes a base 302 having a top surface 302a, a bottom surface 302b located opposite the top surface 302a, a front edge 302c extending between the top surface 302a and the bottom surface 302b, a rear edge 302d located opposite the front edge 302c and extending between the top surface 302a and the bottom surface 302b, and a pair of opposing side edges 302e and 302f extending between the top surface 302a, the bottom surface 302b, and front edge 302c, and the rear edge 302d. A plurality of component couplers 304 are located on the top surface 302a of the board 300, each component coupler 304 defining a component slot 304a and including a pair of latches 304b located on each side of the component slot 304a.

Figure 4:
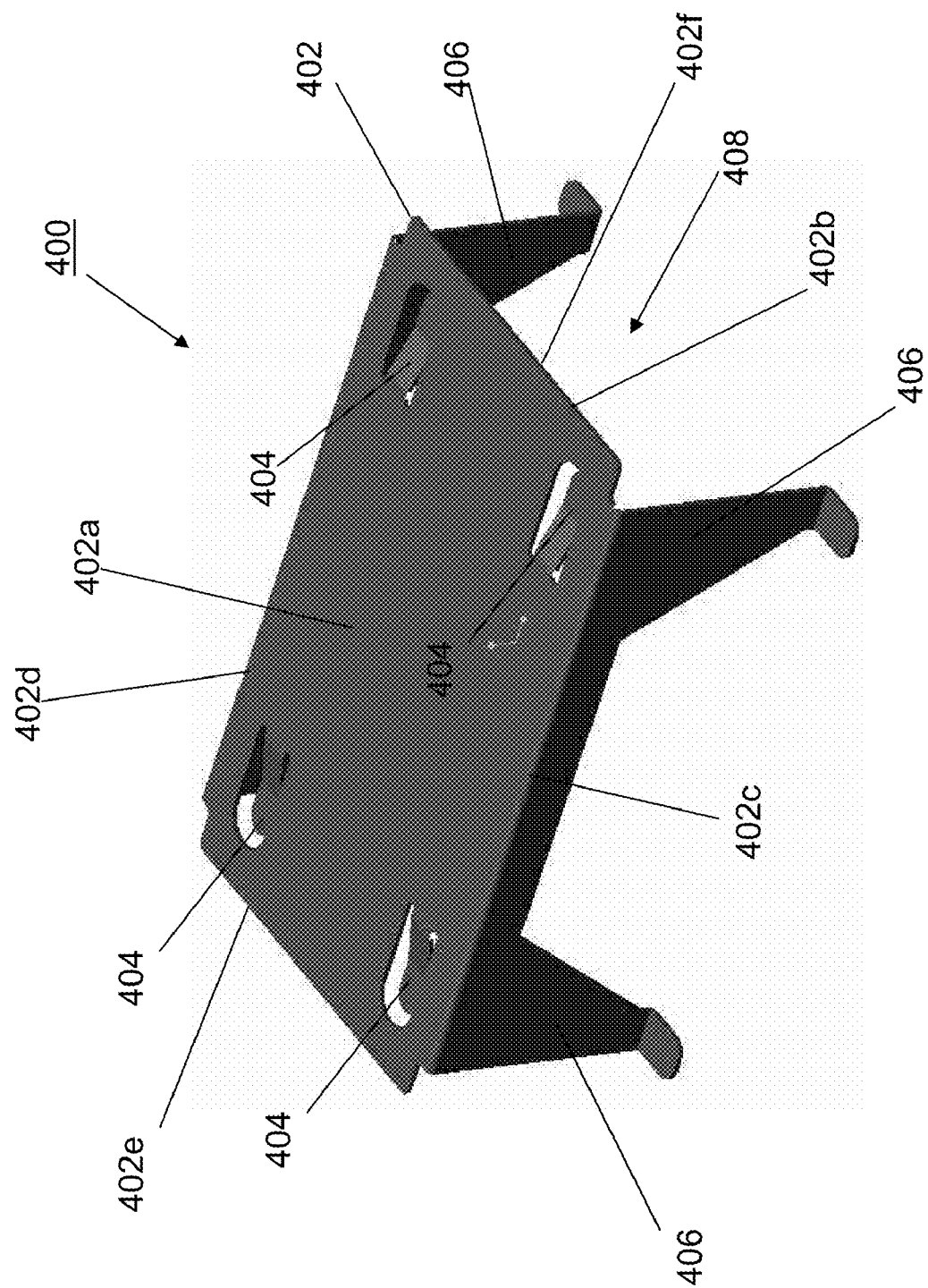
FIG. 4 is a perspective view illustrating an embodiment of a mounting structure used with the HPC of FIGS. 2a, 2b and 2c and the board of FIG. 3.

Referring now to FIG. 4, a mounting structure 400 is illustrated. The mounting structure includes a base 402 having a top surface 402a, a bottom surface 402b located opposite the top surface 402a, a front edge 402c extending between the top surface 402a and the bottom surface 402b, a rear edge 402d located opposite the front edge 402c and extending between the top surface 402a and the bottom surface 402b, and a pair of opposing side edges 402e and 402f extending between the top surface 402a, the bottom surface 402b, and front edge 402c, and the rear edge 402d. In an embodiment, the base 402 includes a plurality of retaining members 404 that extends from base 402 and past the bottom surface 402b. A plurality of legs 406 extend from the front edge 402c and the rear edge 402d on either side of the base 402. A component channel 408 is defined between the base 402 and the legs 406.

Figure 5A:
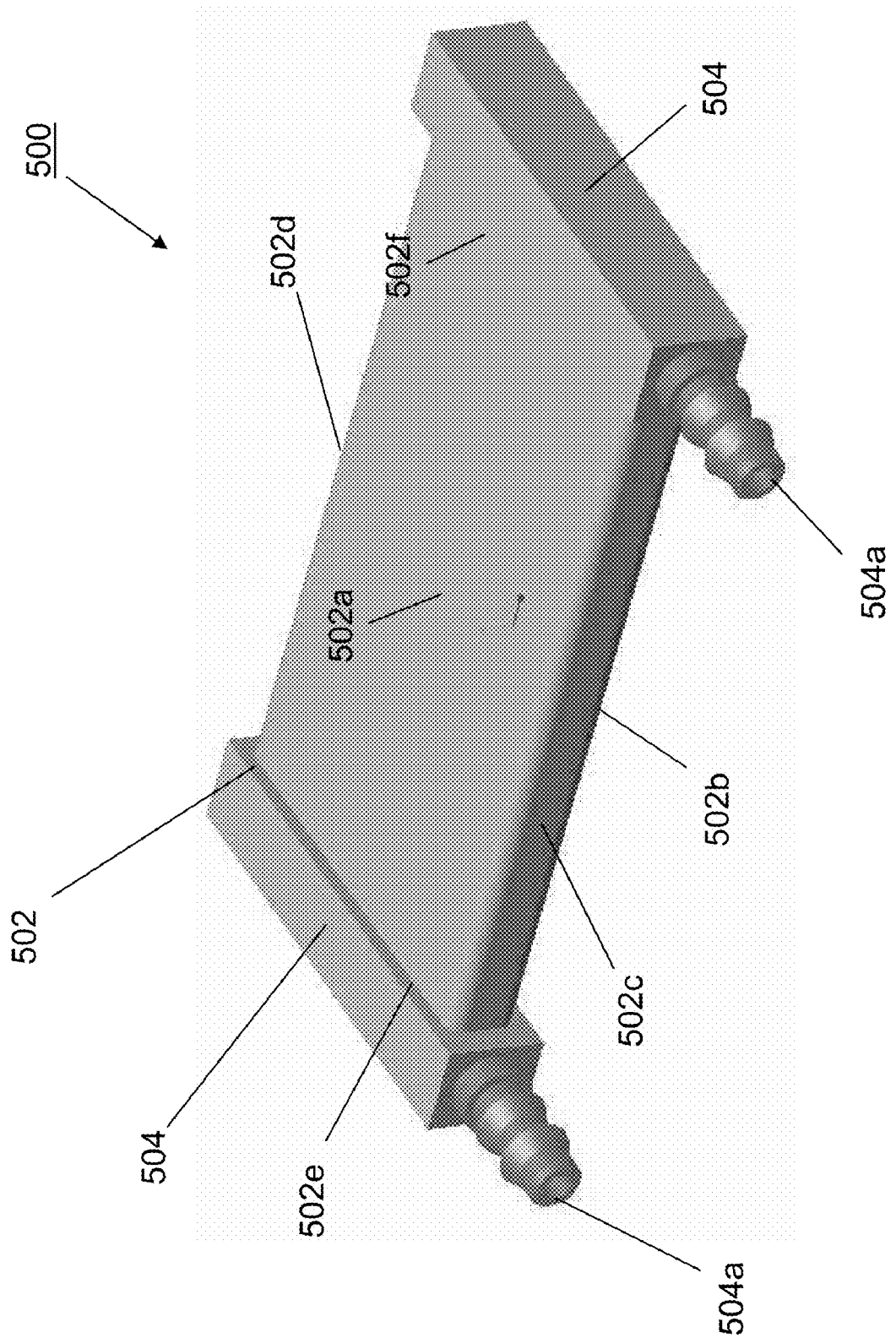
FIG. 5a is a top perspective view illustrating an embodiment of a liquid cooling device used with the HPC of FIGS. 2a, 2b and 2c, the board of FIG. 3, and the mounting structure of FIG. 4.
Figure 5B:
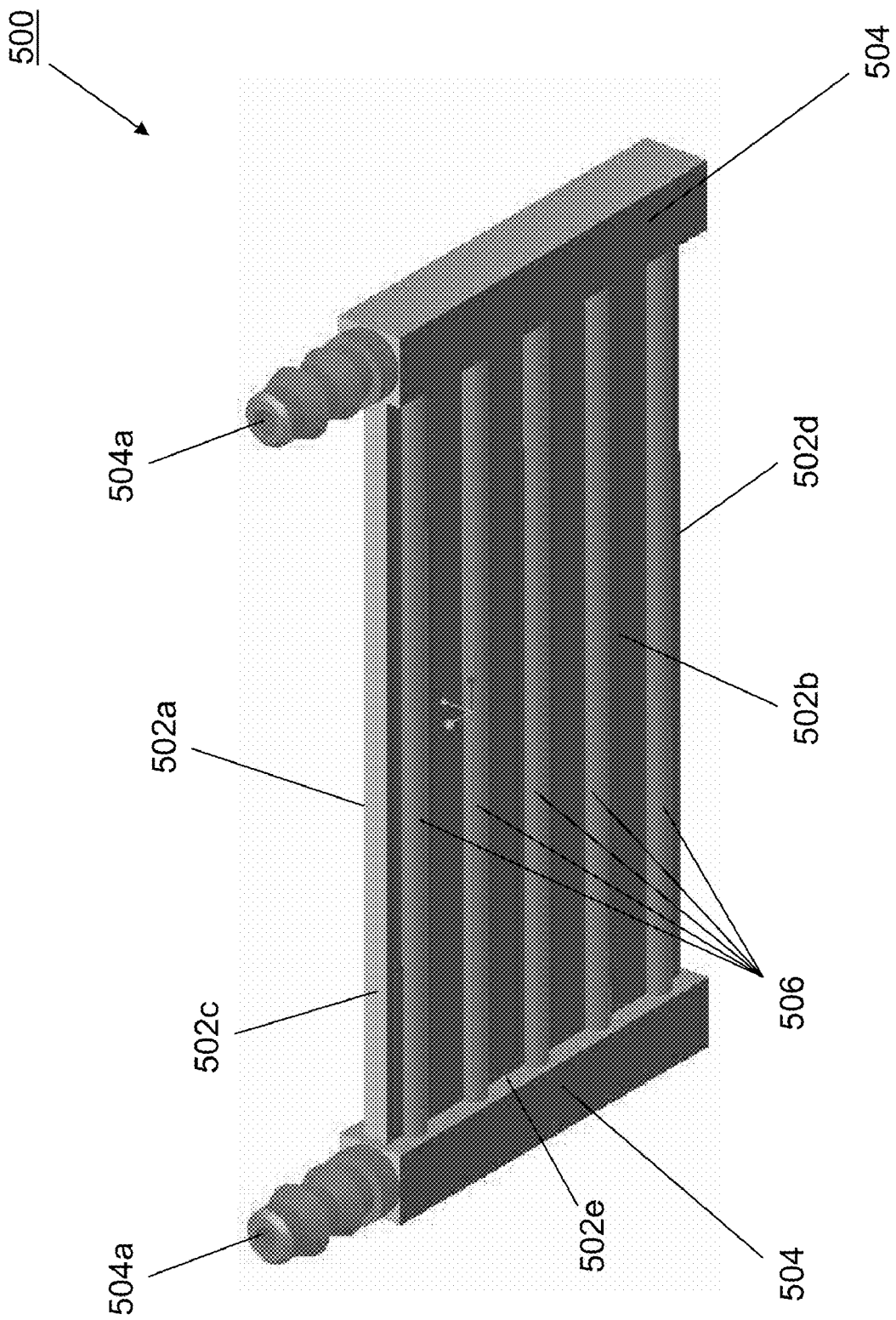
Figure 5C:
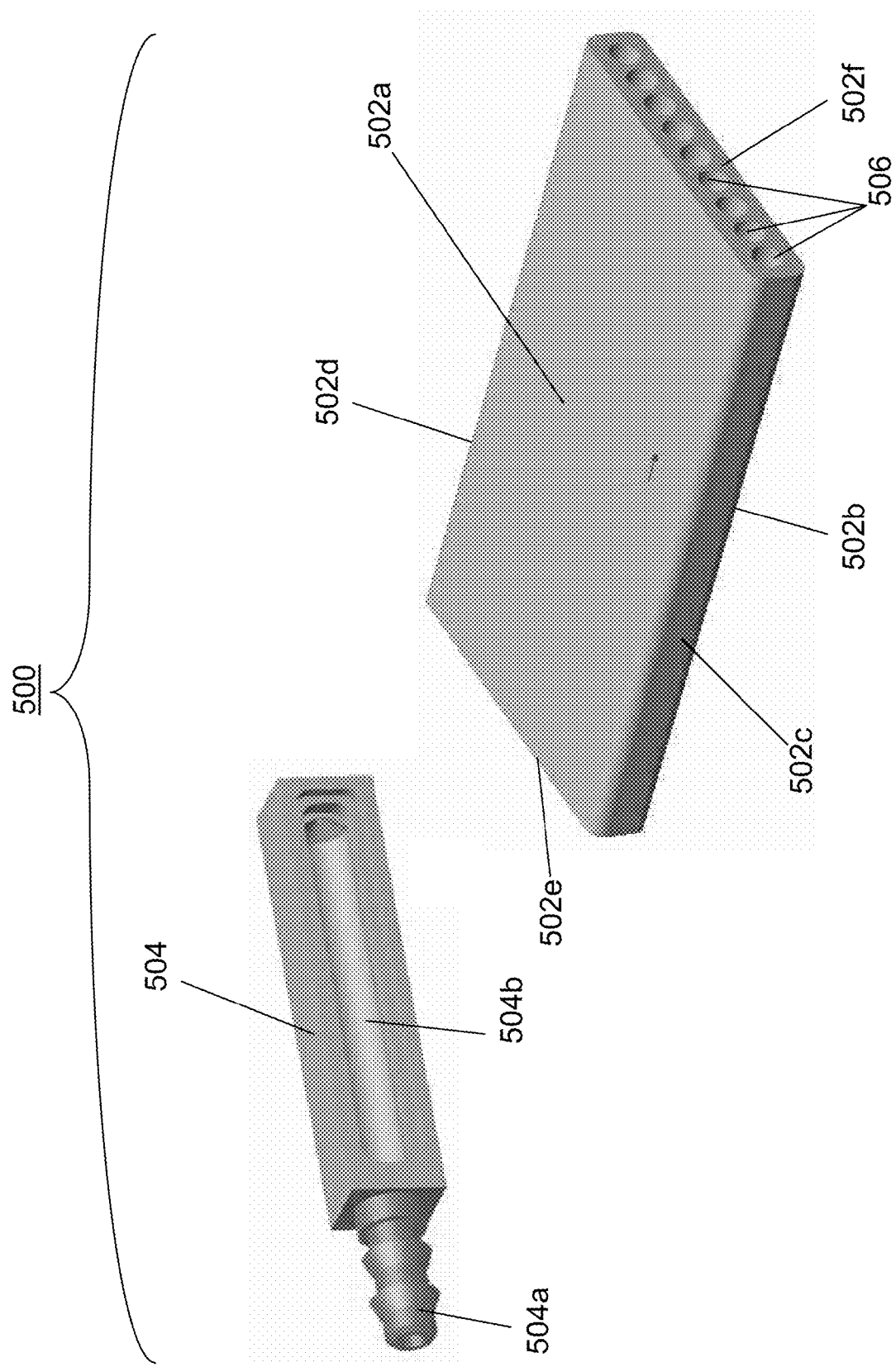

Referring now to FIGS. 5a, 5b and 5c, a liquid cooling device 500 is illustrated. The liquid cooling device 500 includes a base 502 having a top surface 502a, a bottom surface 502b located opposite the top surface 502a, a front edge 502c extending between the top surface 502a and the bottom surface 502b, a rear edge 502d located opposite the front edge 502c and extending between the top surface 502a and the bottom surface 502b, and a pair of opposing side edges 502e and 502f extending between the top surface 502a, the bottom surface 502b, and front edge 502c, and the rear edge 502d. A conduit 504 is coupled to each of the side edges 502e and 502f of the base 502, with each conduit 504 including a fitting 504a located on its distal end. In one embodiment, illustrated in FIG. 5b, the conduits 504 include passageways that run through the fittings 504 and that are coupled to a plurality of tubes 506 that extends across the bottom surface 502b of the base 502 and between the conduits 504 such that fluid may be supplied to a first conduit 504 and flow through that conduit 504, the plurality of tubes 506, and out through a second conduit 504. In another embodiment, illustrated in FIG. 5c, the base 502 defines a plurality of passageways 506 that extend through the base 502 from the side edge 502e to the side edge 502f and couple to passageways 504b defined by each of the conduits 504 such that fluid may be supplied to a first conduit 504 and flow through that conduit 504, the passageways 506 on the base 502, and out through a second conduit 504.

Figure 6A:
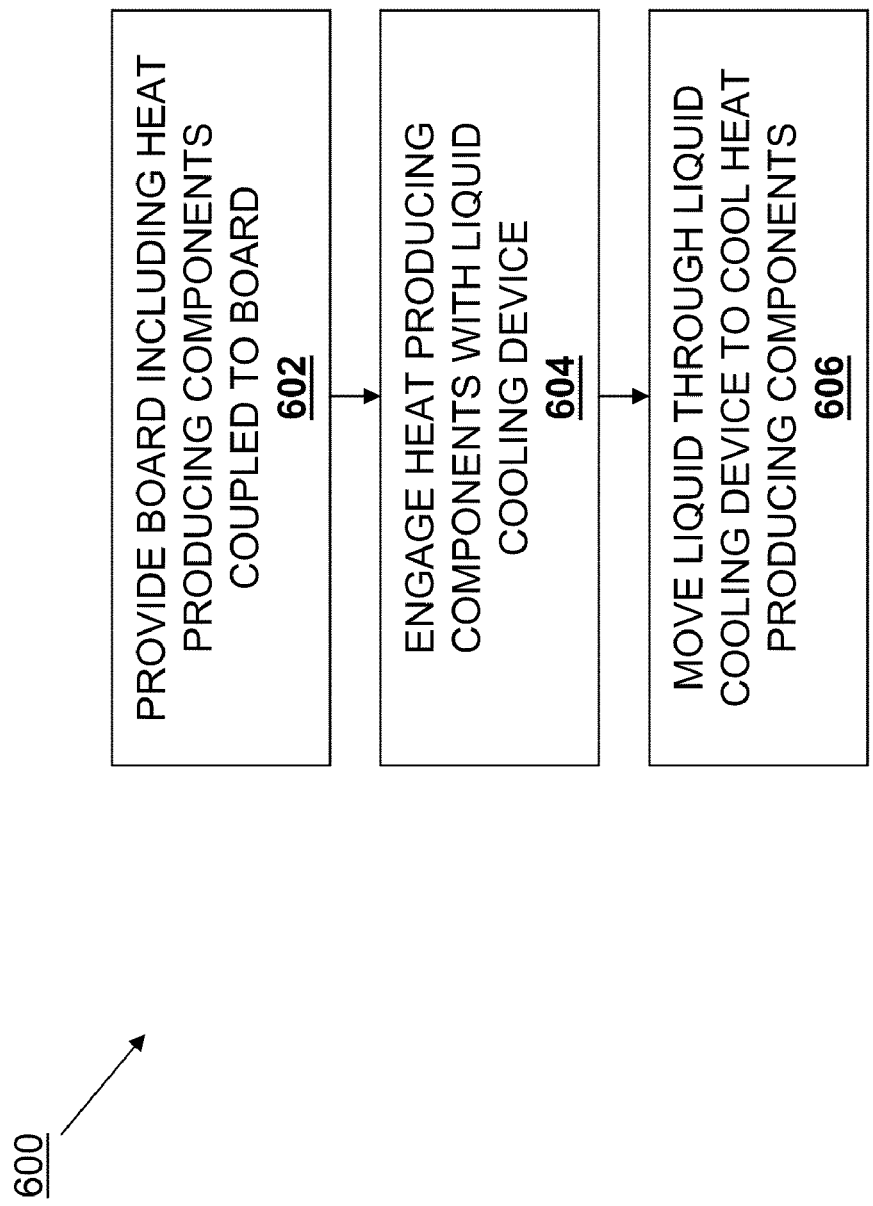
FIG. 6a is a flow chart illustrating an embodiment of a method for cooling a plurality of HPCs.
Figure 6B:
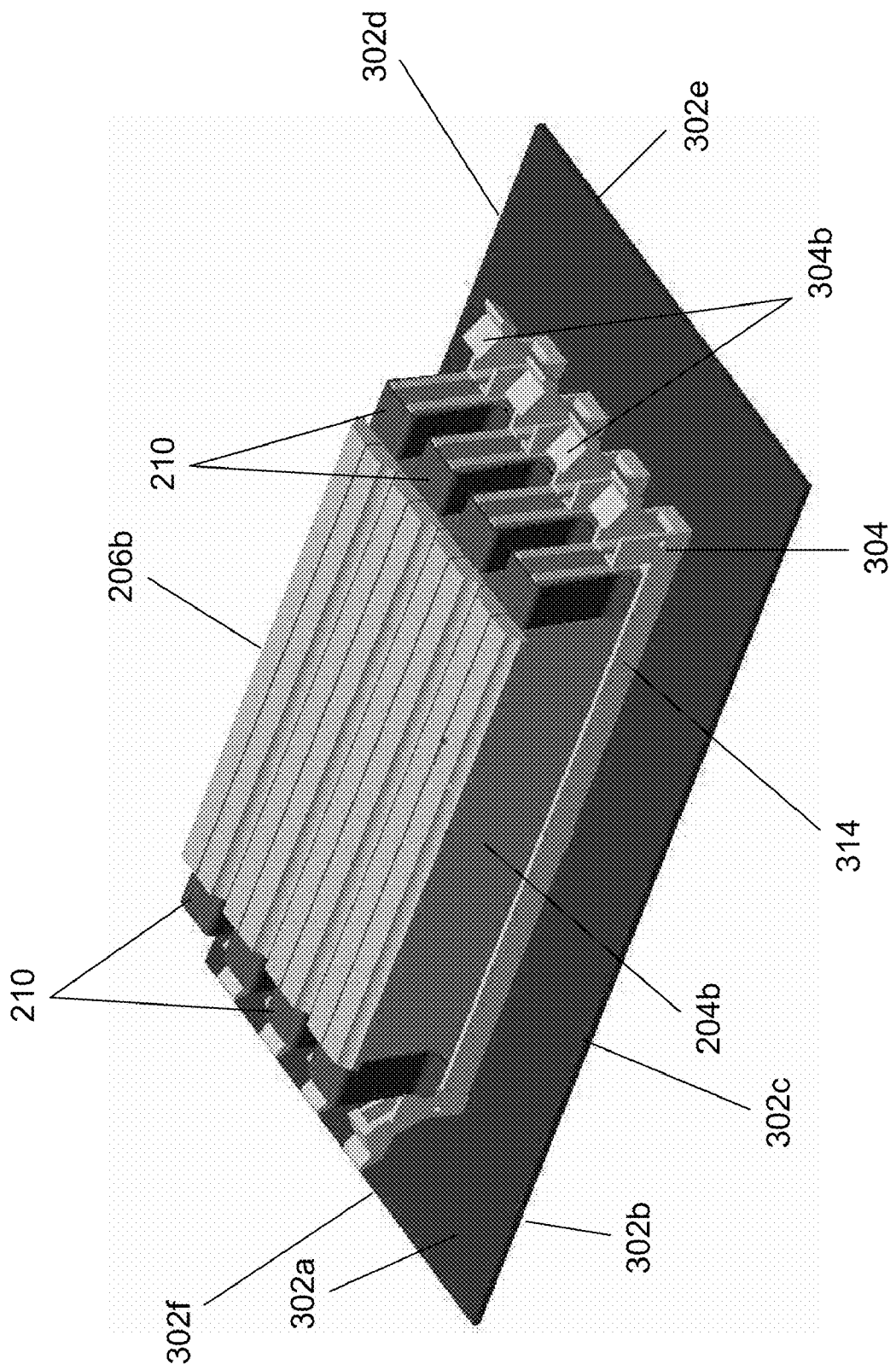
FIG. 6b is a perspective illustrating an embodiment of a plurality of the HPCs of FIGS. 2a, 2b and 2c coupled to the board of FIG. 3.

Referring now to FIGS. 2a, 2b, 2c, 3, 6a and 6b, a method 600 for cooling a plurality of HPCs is illustrated. The method 600 begins at block 602 where a board including a plurality of HPCs is provided. In an embodiment, a plurality of the HPCs 200 may be coupled to the board 300 by positioning the bottom edge 202d of a respective HPC 200 in the respective component slot 304a on a component coupler 304 and then engaging the HPC 200 with the latches 304b on either side of component slot 304a, as illustrated in FIG. 6b.

Figure 6C:
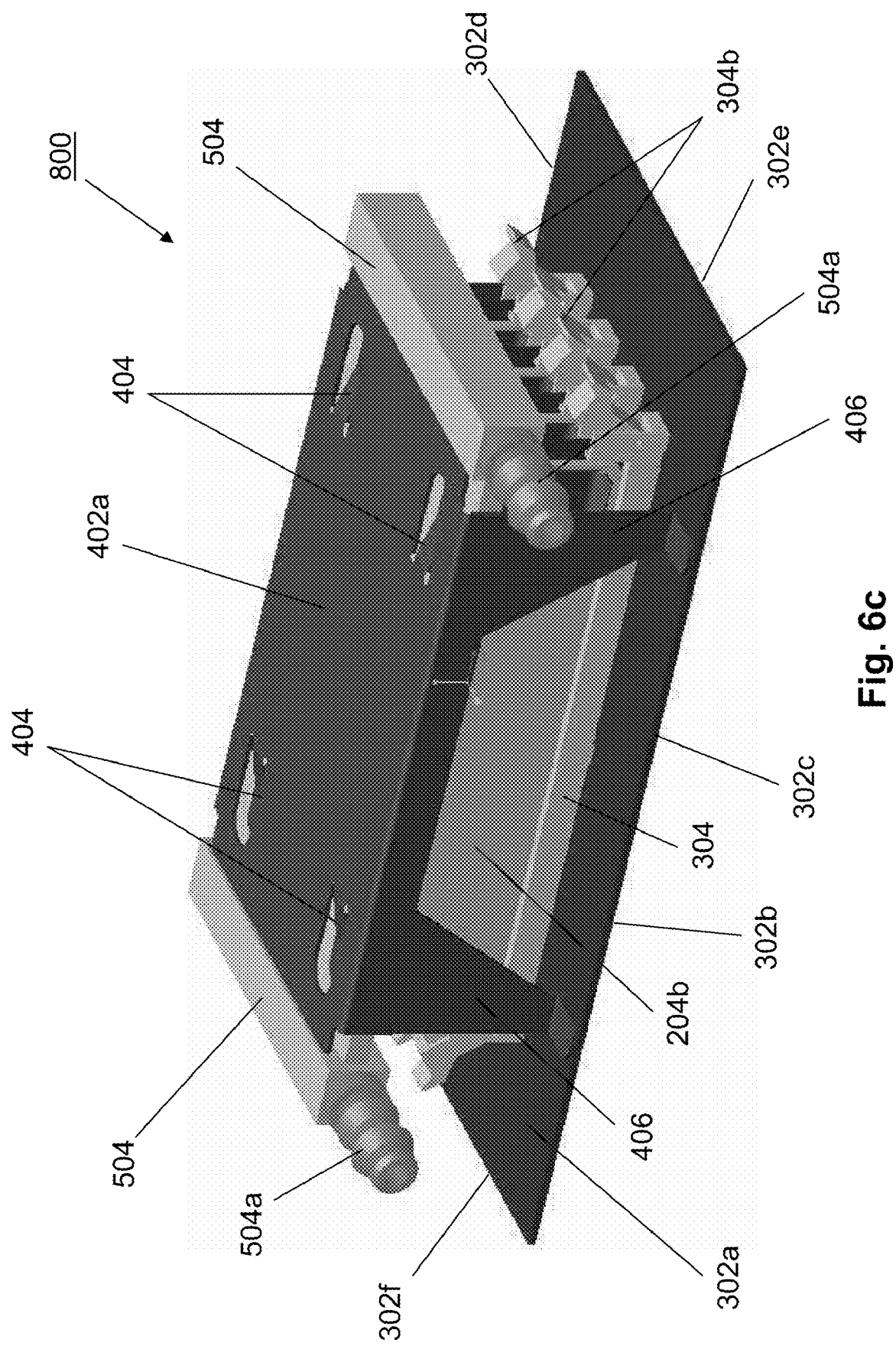
FIG. 6c is a perspective illustrating an embodiment of the mounting structure of FIG. 4 coupling the liquid cooling device of FIGS. 5a, 5b and 5c to the HPCs and the board of FIG. 6b.
Figure 6D:
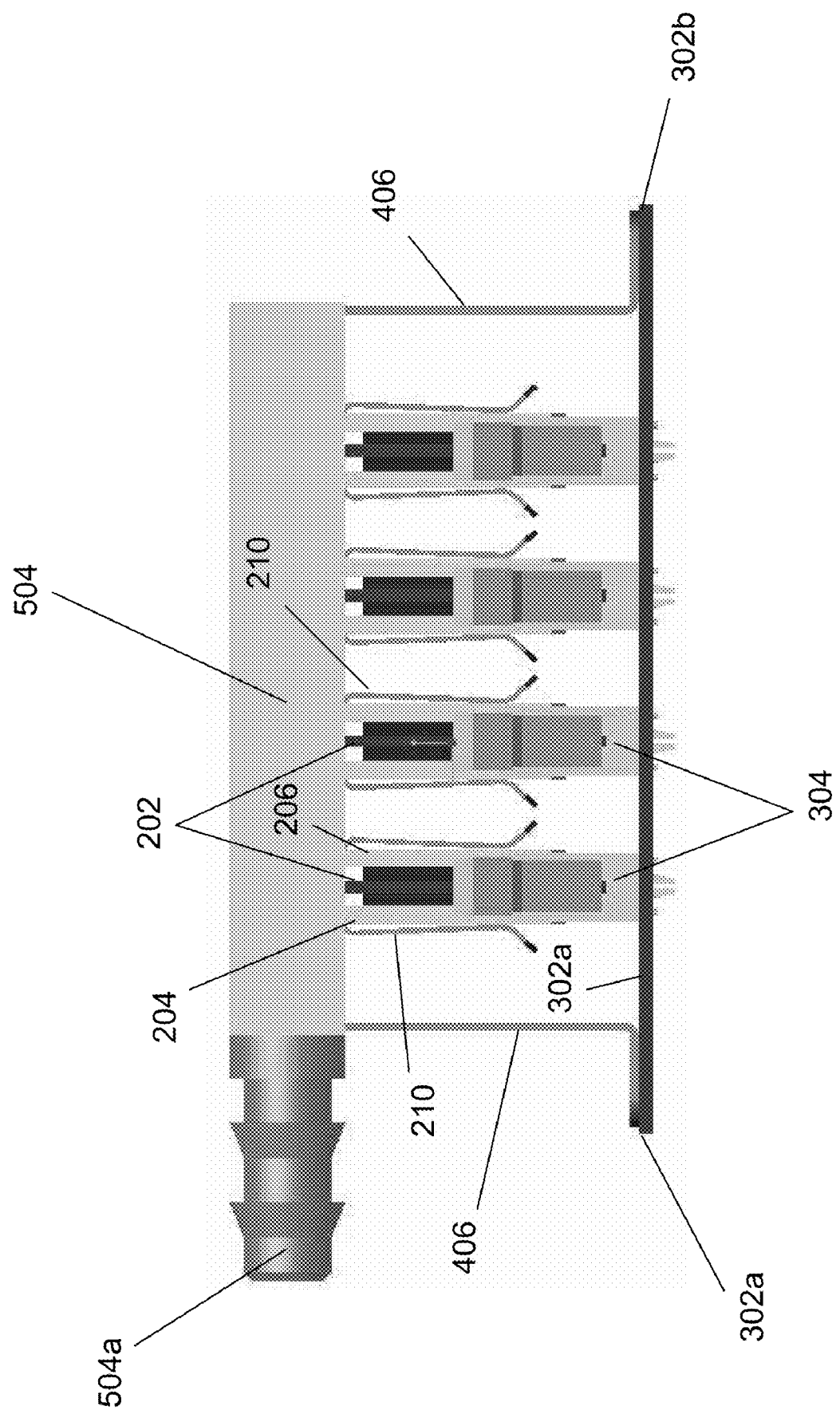
FIG. 6d is a side view illustrating an embodiment of the board, the HPCs, the liquid cooling device, and the mounting structure of FIG. 6c.
Figure 6E:
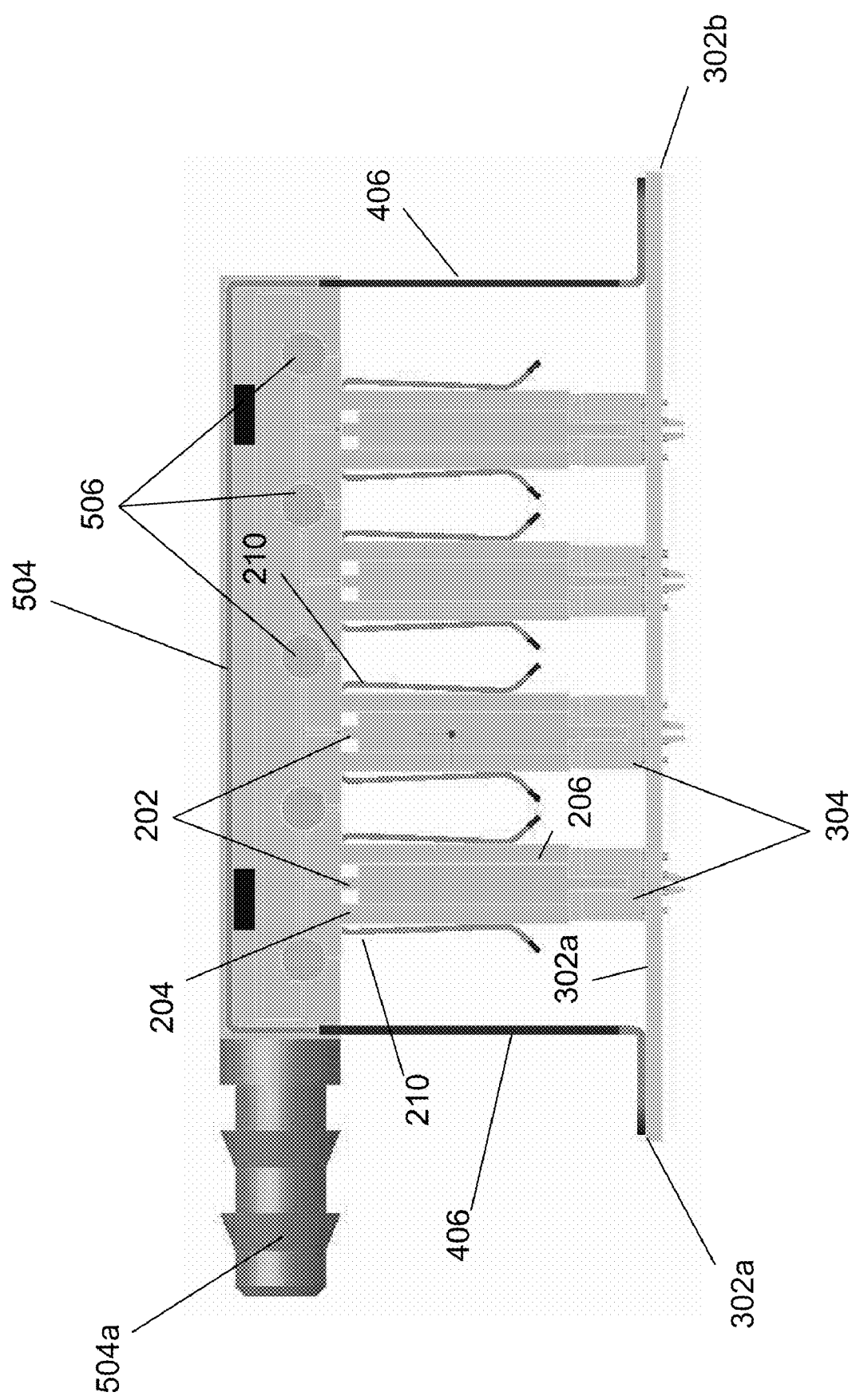
FIG. 6e is a cross-section view illustrating an embodiment of the board, the HPCs, the liquid cooling device, and the mounting structure of FIG. 6c.

Referring now to FIGS. 4, 5a, 5b, 5c, 6a, 6c, 6d and 6e, the method 600 then proceeds to block 604 where the HPCs are engaged with a liquid cooling device. The liquid cooling device 500 is engaged with the plurality of HPCs 200 by positioning the liquid cooling device 500 adjacent the plurality of HPCs 200 such that the bottom surface 502b of the liquid cooling device 500 engages a surface on the heat spreaders 204 and 206 of the plurality of HPCs 200. The mounting structure 400 is then positioned over the liquid cooling device 500 and the HPCs 200 such that the liquid cooling device 500 and the HPCs 200 are located in the component channel 408 defined by the mounting structure 400, as illustrated in FIG. 6c. The mounting structure 400 may then be secured to the board 300 using methods known in the art. With the mounting structure 400 secured to the board 300, the bottom surface 502b of the liquid cooling device 500 is held in engagement with the plurality of HPCs 200, as illustrated in FIG. 6d. In an embodiment, a thermal interface material may be located between bottom surface 502b of the liquid cooling device 500 and the HPCs 200 in order to facilitate the transfer of heat from the HPCs 200 to the liquid cooling device 500. The coupling of the mounting structure 400 to the board 300 may be accomplished using fasteners such as a screws, tool less fasteners, and/or a variety of other fasteners known in the art. The method 600 may then proceed to block 606 where liquid is moved through the liquid cooling device to cool the plurality of HPCs. Conduits such as, for example, flexible tubes (not illustrated) may be coupled to the fittings 504a such that liquid may be supplied to through the conduits 504 to the base 502 (or, in one embodiment, the plurality of tubes 506 coupled to the base 502, as illustrated in FIG. 6e). By moving liquid through the base 502, heat may be transferred from the HPCs 200 to the liquid, and that heated liquid may then leave the base to be replaced by cooler liquid, thereby facilitating heat transfer from the memory devices 202. Furthermore, the system described above allows the mounting structure 400 to be decoupled from the board 300 and the liquid cooling device 500 to be disengaged from the plurality of HPCs 200 without the need to disconnect the conduits that supply liquid to the liquid cooling device 500. With the liquid cooling device 500 disengaged from the plurality of HPCs 200, any or all of the HPCs 200 may be quickly and easily removed or replaced with other HPCs 200 and the liquid cooling device 500 may then be re-engaged with the HPCs 200 to again provide cooling. Thus, a system and method are provided that allow a plurality of HPCs to be cooled by a single liquid cooling device that may be removed quickly and easily without the need to remove its liquid supply and such that any or all of the HPCs may be quickly and easily replaced. Furthermore, the use of the single liquid cooling device to cool the plurality of HPCs allows larger conduits to be used to supply liquid to the liquid cooling device while also allowing for larger liquid passageways in the liquid cooling device relative to conventional liquid cooling systems. This reduces the pressure needed to move liquid through the liquid cooling system and allows more heat to transferred relative to conventional liquid cooling systems.

Figure 7:
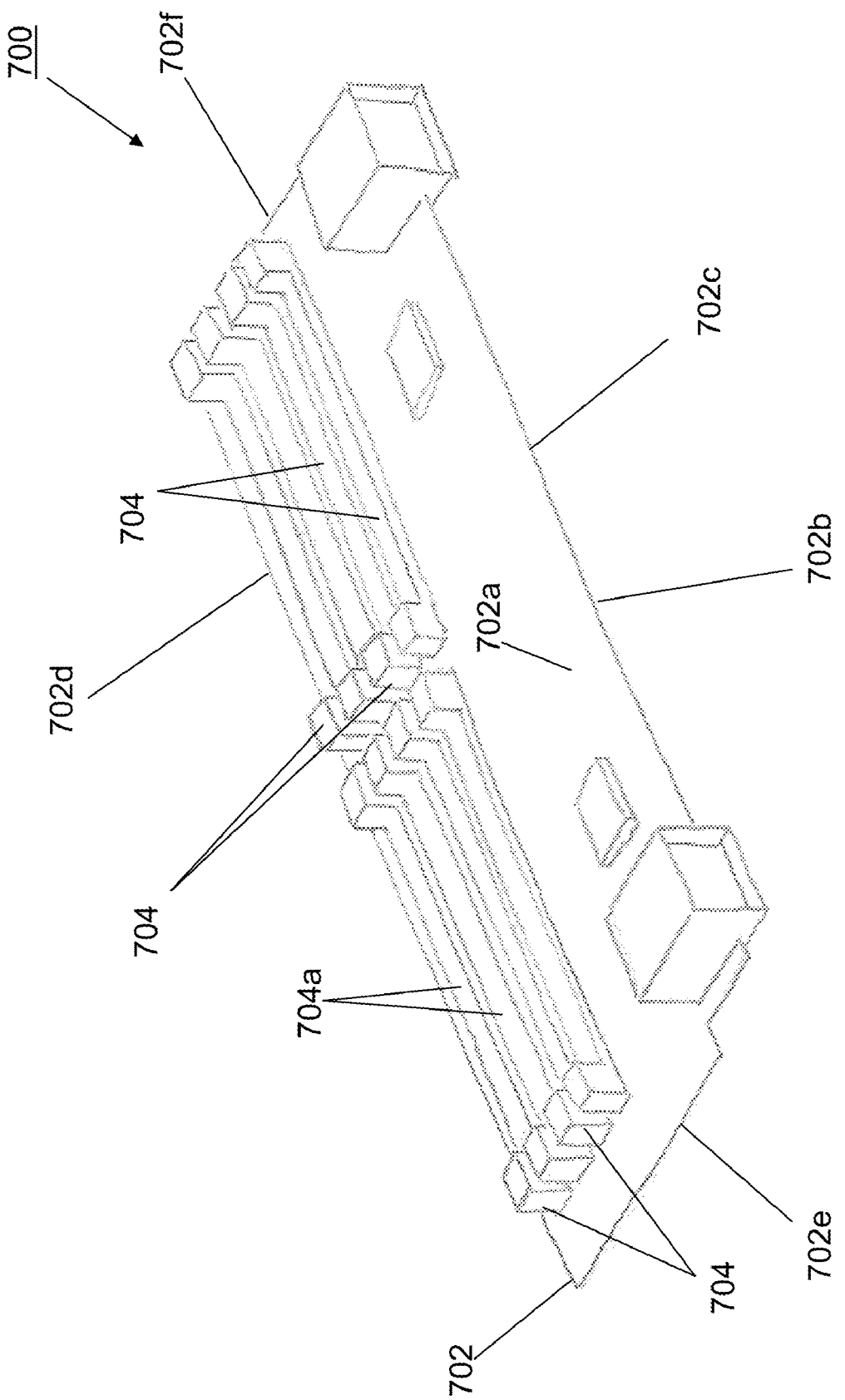
FIG. 7 is a perspective view illustrating an embodiment of a board used with the HPCs of FIGS. 2a, 2b and 2c.

Referring now to FIG. 7, an embodiment of a board 700 is illustrated. The board 700 includes a base 702 having a top surface 702a, a bottom surface 702b located opposite the top surface 702a, a front edge 702c extending between the top surface 702a and the bottom surface 702b, a rear edge 702d located opposite the front edge 702c and extending between the top surface 702a and the bottom surface 702b, and a pair of opposing side edges 702e and 702f extending between the top surface 702a, the bottom surface 702b, and front edge 702c, and the rear edge 702d. A plurality of component couplers 704 are located on the top surface 702a of the board 700, each component coupler 704 defining a component slot 704a and including means for coupling components to the component couplers 704.

Figure 8:
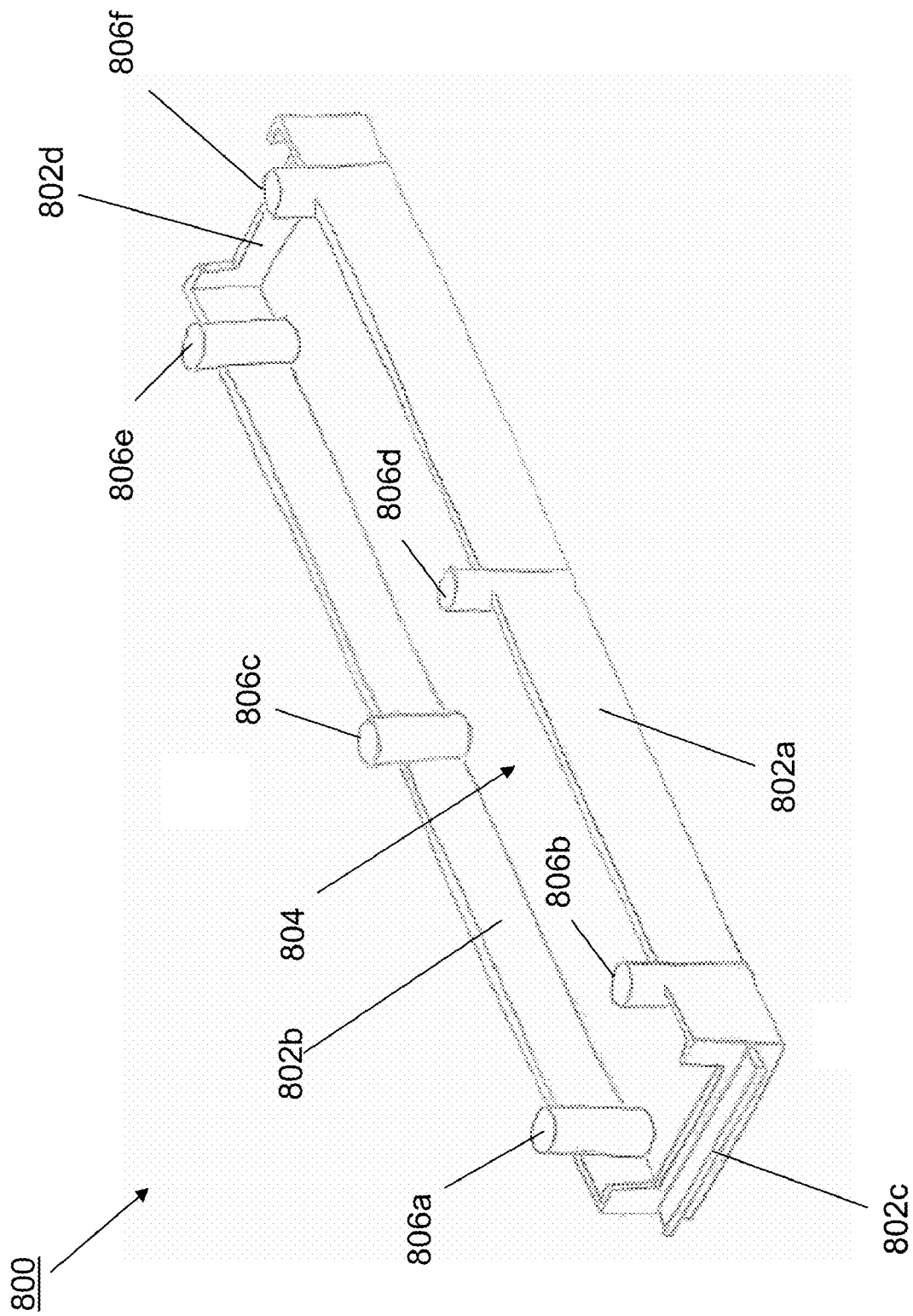
FIG. 8 is a perspective view illustrating an embodiment of a mounting structure used with the HPCs of FIGS. 2a, 2b and 2c and the board of FIG. 7.

Referring now to FIG. 8, a mounting structure 800 is illustrated. The mounting structure 800 includes a front wall 802a, a rear wall 802b located opposite the front wall 802a, and a pair of side walls 802c and 802d that extend between the front wall 802a and the rear wall 802b. A component channel 804 is defined between the front wall 802a, the rear wall 802b, and the pair of sides walls 802c and 802d. A plurality of mounting pillars 806a, 806b, 806c, 806d, 806e and 806f are located along the front wall 802a and the rear wall 802b in a spaced apart orientation, with the mounting pillars 806a and 806b located adjacent the side wall 802c, the mounting pillars 806e and 806f located adjacent the side wall 802d, and the mounting pillars 806c and 806d located between the sides walls 802c and 802d.

Figure 9:
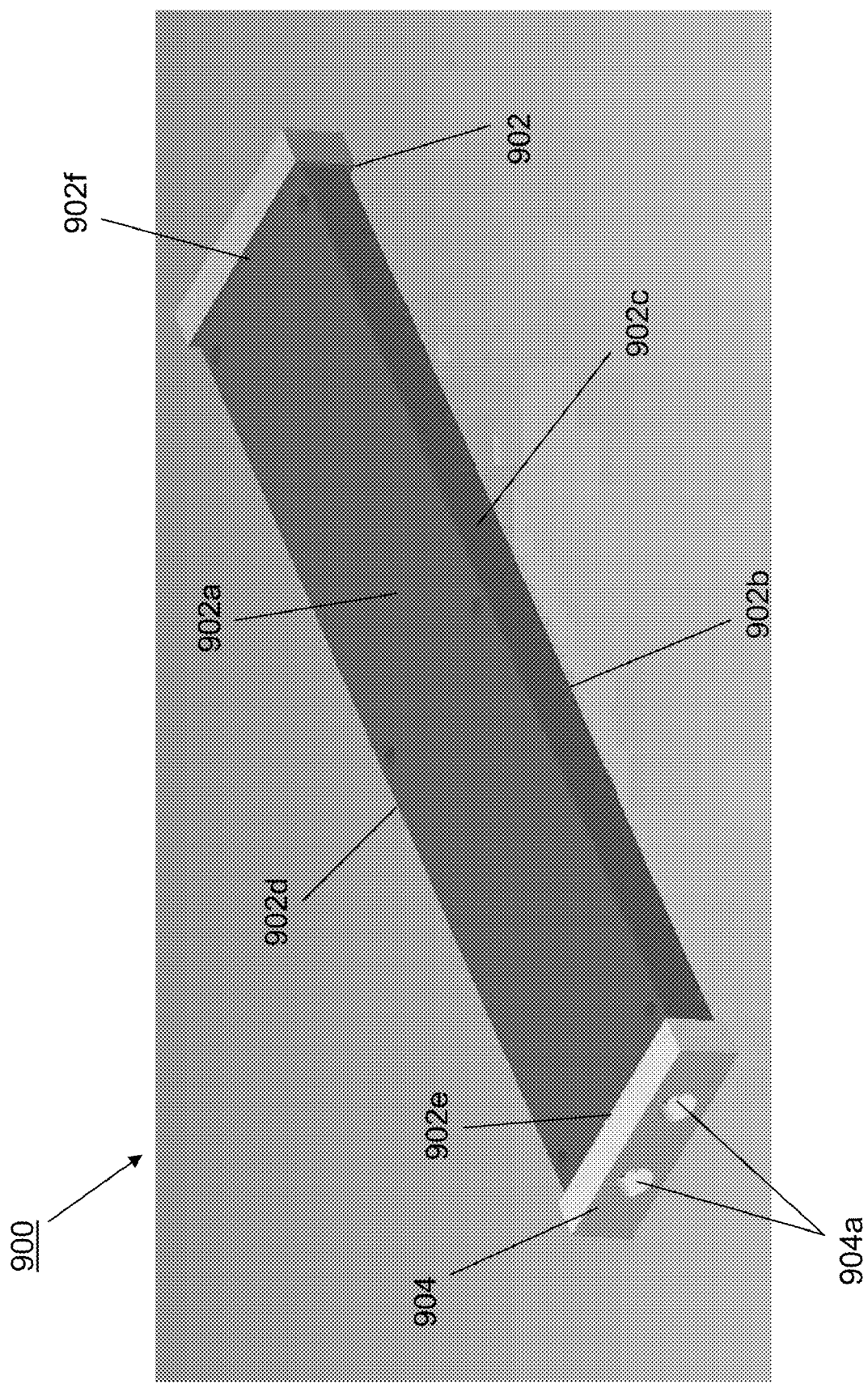
FIG. 9 is a perspective view illustrating an embodiment of a liquid cooling device used with the HPCs of FIGS. 2a, 2b and 2c, the board of FIG. 7, and the mounting structure of FIG. 8.

Referring now to FIG. 9, a liquid cooling device 900 is illustrated. The liquid cooling device 900 includes a base 902 having a top surface 902a, a bottom surface 902b opposite the top surface 902a, a front edge 902c extending between the top surface 902a and the bottom surface 902b, a rear edge 902d located opposite the front edge 902c and extending between the top surface 902a and the bottom surface 902b, and a pair of opposing side edges 902e and 902f extending between the top surface 902a, the bottom surface 902b, the front edge 902c, and the rear edge 902d. A fitting 904 is coupled to the side edge 902e of the base 902 and a pair of access apertures 904a that provide access to a liquid passageway (not shown) defined by the base 902. In an embodiment, the passageways extend through the base 902 from the side edge 502e such that fluid may be supplied to a first access aperture 904a, flow through the passageways in the base 902, and out through a second aperture 904a.

Figure 10A:
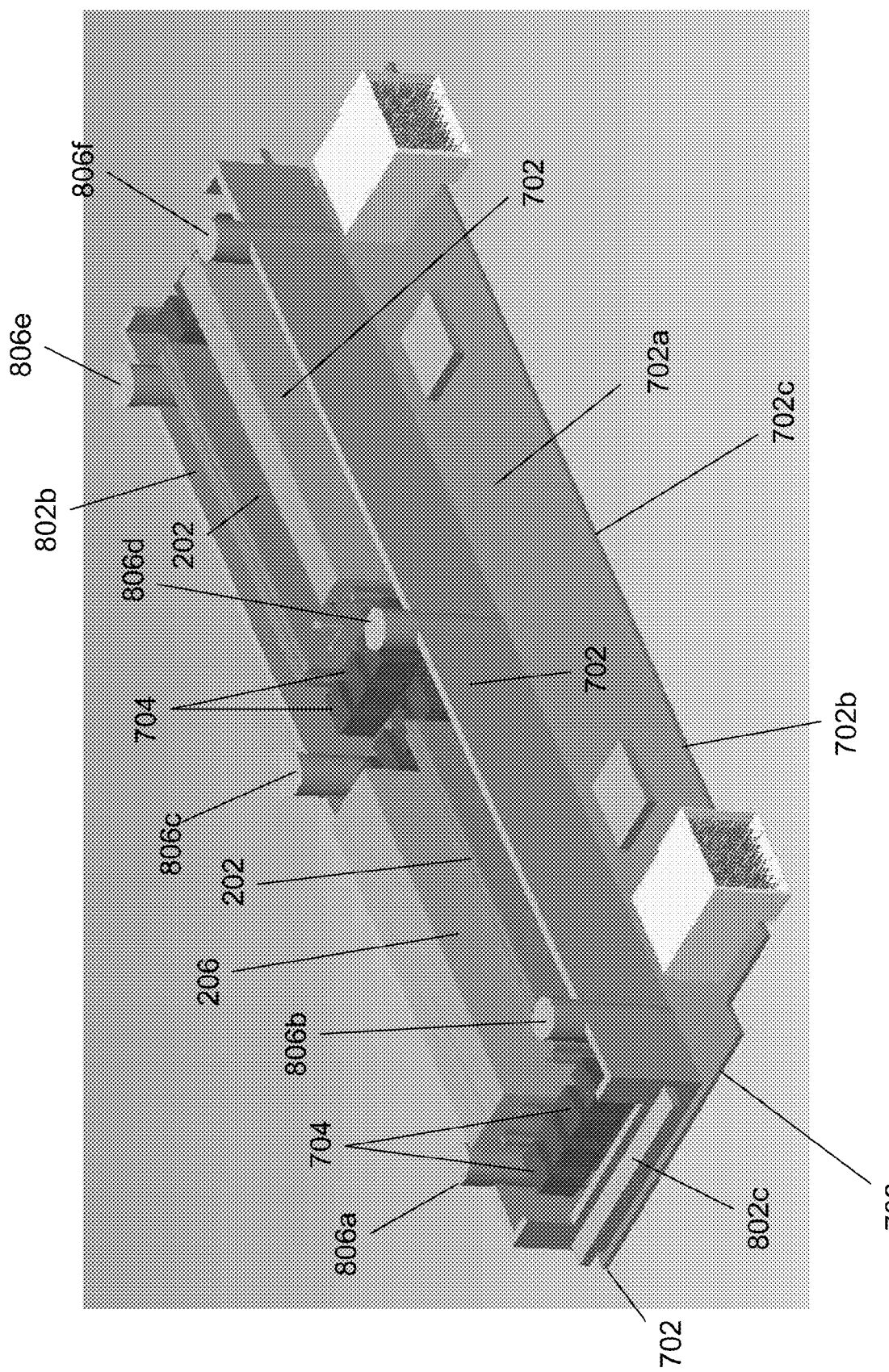
FIG. 10a is a perspective view illustrating an embodiment of the HPCs of FIGS. 2a, 2b and 2c and the mounting structure of FIG. 8 coupled to the board of FIG. 7.

Referring now to FIGS. 2a, 2b, 2c, 6a, 7, 8, 9, 10a and 10b, the method 600 may be performed using the HPC 200, the board 700, the mounting structure 800, and the liquid cooling device 900. The method 600 begins at block 602 where a board including a plurality of HPCs is provided. In an embodiment, the mounting structure 800 is coupled to the board 700 using fasteners (e.g., screws, tool less fasteners, and/or a variety of other fasteners known in the art) such that the component couplers 704 are located in the component channel 804 defined by the mounting structure 800. A plurality of the HPCs 200 may then be coupled to the board 700 by positioning the bottom edge 202d of a respective HPC 200 in the respective component slot 704a on a component coupler 704 and then securing the HPC 200 to the component coupler 704 using methods known in the art, as illustrated in FIG. 10a.

Figure 10B:
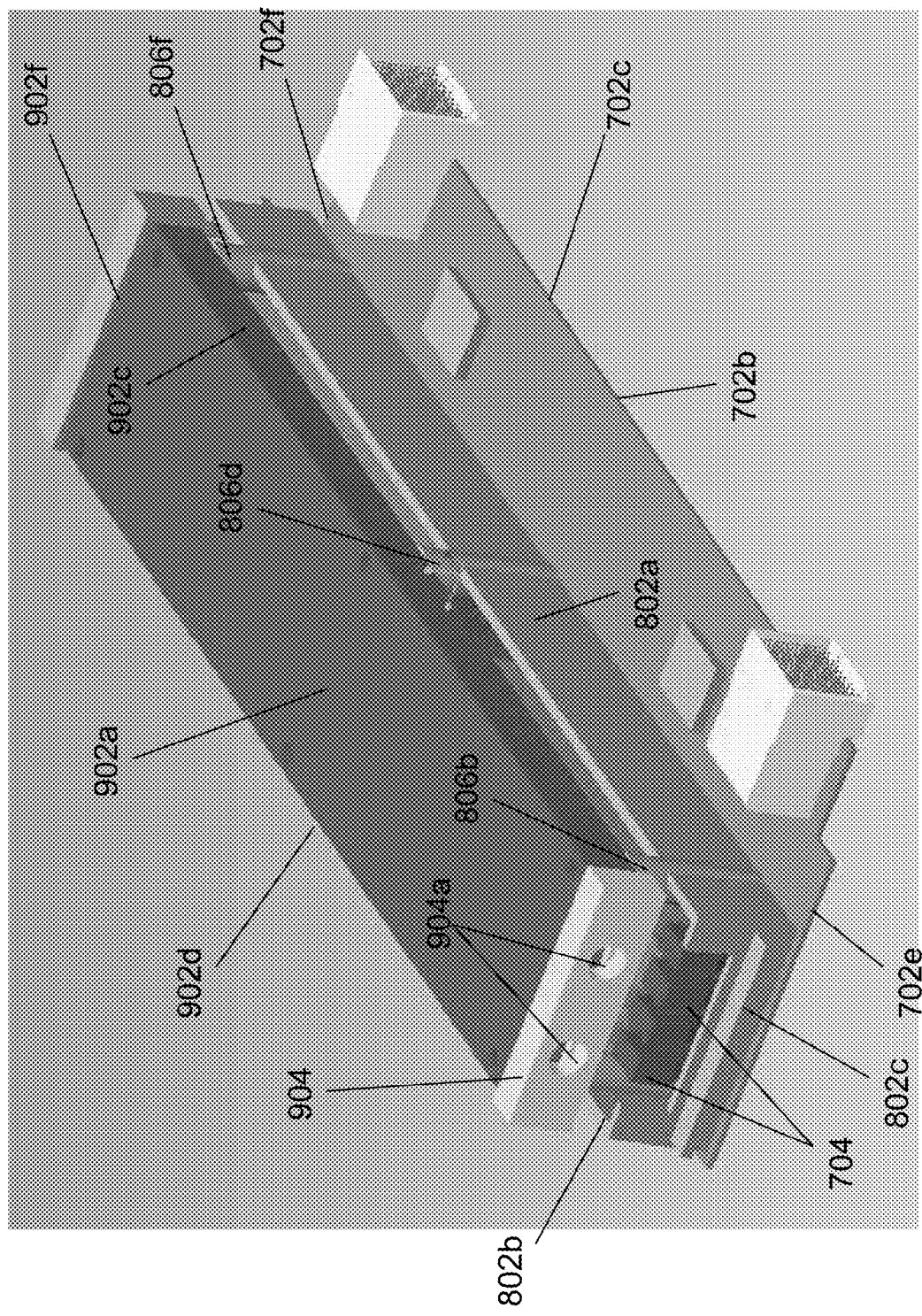

The method 600 then proceeds to block 604 where the HPCs are engaged with a liquid cooling device. The liquid cooling device 900 is engaged with the plurality of HPCs 200 by positioning the liquid cooling device 900 adjacent the plurality of HPCs 200 and the mounting structure 800 such that the liquid cooling device 900 engages the mounting pillars 806a, 806b, 806c, 806d, 806e and 806f and the bottom surface 902b of the liquid cooling device 900 engages the memory devices 202 and/or the heat spreaders 204 and 206 on the plurality of HPCs 200, as illustrated in FIG. 10b. In an embodiment, the liquid cooling device 900 may be secured to the mounting structure 800 using fasteners (e.g., screws, tool less fasteners, and/or a variety of other fasteners known in the art). With the liquid cooling device 900 secured to the mounting structure 800, the bottom surface 902b of the liquid cooling device 900 is held in engagement with the plurality of HPCs 200. In an embodiment, a thermal interface material may be located between bottom surface 902b of the liquid cooling device 900 and the HPCs 200 in order to facilitate the transfer of heat from the HPCs 200 to the liquid cooling device 900. The method 600 may then proceed to block 606 where liquid is moved through the liquid cooling device to cool the plurality of HPCs. Conduits such as, for example, flexible tubes (not illustrated) may be coupled to the access apertures 904a on the fitting 904 such that liquid may be supplied to through the fitting 904 to the base 902. By moving liquid through the base 902, heat may be transferred from the HPCs 200 to the liquid, and that heated liquid may then leave the base to be replaced by cooler liquid, thereby facilitating heat transfer from the memory devices 202. Furthermore, the system described above allows the liquid cooling device 900 to be decoupled from the mounting structure 800 and disengaged from the plurality of HPCs 200 without the need to disconnect the conduits that supply liquid to the liquid cooling device 900. With the liquid cooling device 900 disengaged from the plurality of HPCs 200, any or all of the HPCs 200 may be quickly and easily removed or replaced with other HPCs 200 and the liquid cooling device 900 may then be re-engaged with the HPCs 200 to again provide cooling. Thus, a system and method are provided that allow a plurality of HPCs to be cooled by a single liquid cooling device that may be removed quickly and easily without the need to remove its liquid supply and such that any or all of the HPCs may be quickly and easily replaced. Furthermore, the use of the single liquid cooling device to cool the plurality of HPCs allows larger conduits to be used to supply liquid to the liquid cooling device while also allowing for larger liquid passageways in the liquid cooling device relative to conventional liquid cooling systems. This reduces the pressure needed to move liquid through the liquid cooling system and allows more heat to transferred relative to conventional liquid cooling systems.

Figure 11:
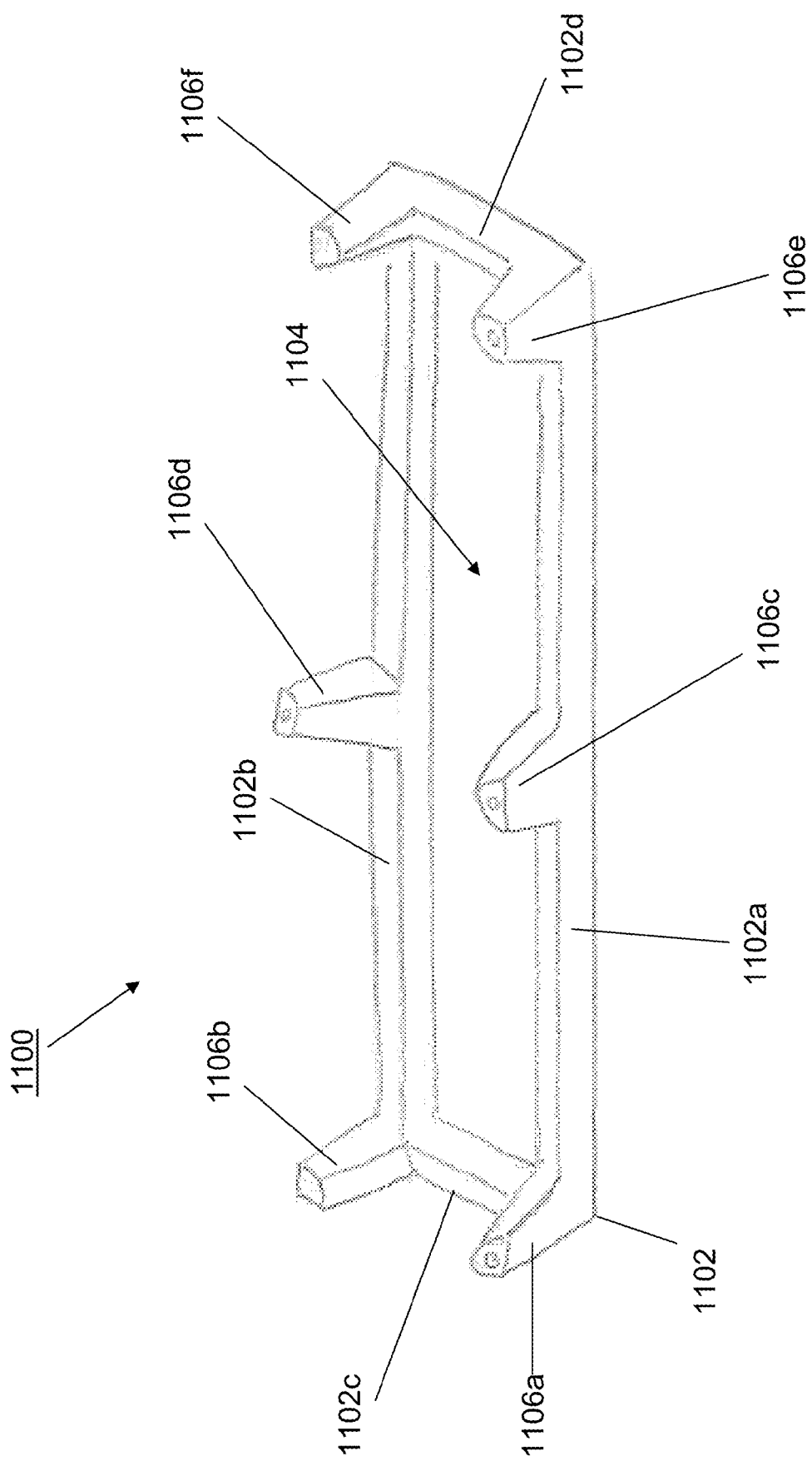
FIG. 11 is a perspective view illustrating an embodiment of a mounting structure used with the HPCs of FIGS. 2a, 2b and 2c and the board of FIG. 7.

Referring now to FIG. 11, a mounting structure 1100 is illustrated. The mounting structure 1100 includes a front wall 1102a, a rear wall 1102b located opposite the front wall 1102a, and a pair of side walls 1102c and 1102d that extend between the front wall 1102a and the rear wall 1102b. A component channel 1104 is defined between the front wall 1102a, the rear wall 1102b, and the pair of sides walls 1102c and 1102d. A plurality of mounting pillars 1106a, 1106b, 1106c, 1106d, 1106e and 1106f are located along the front wall 1102a and the rear wall 1102b in a spaced apart orientation, with the mounting pillars 1106a and 1106b located adjacent the side wall 1102c, the mounting pillars 1106e and 1106f located adjacent the side wall 1102d, and the mounting pillars 1106c and 1106d located between the sides walls 1102c and 1102d.

Figure 12:
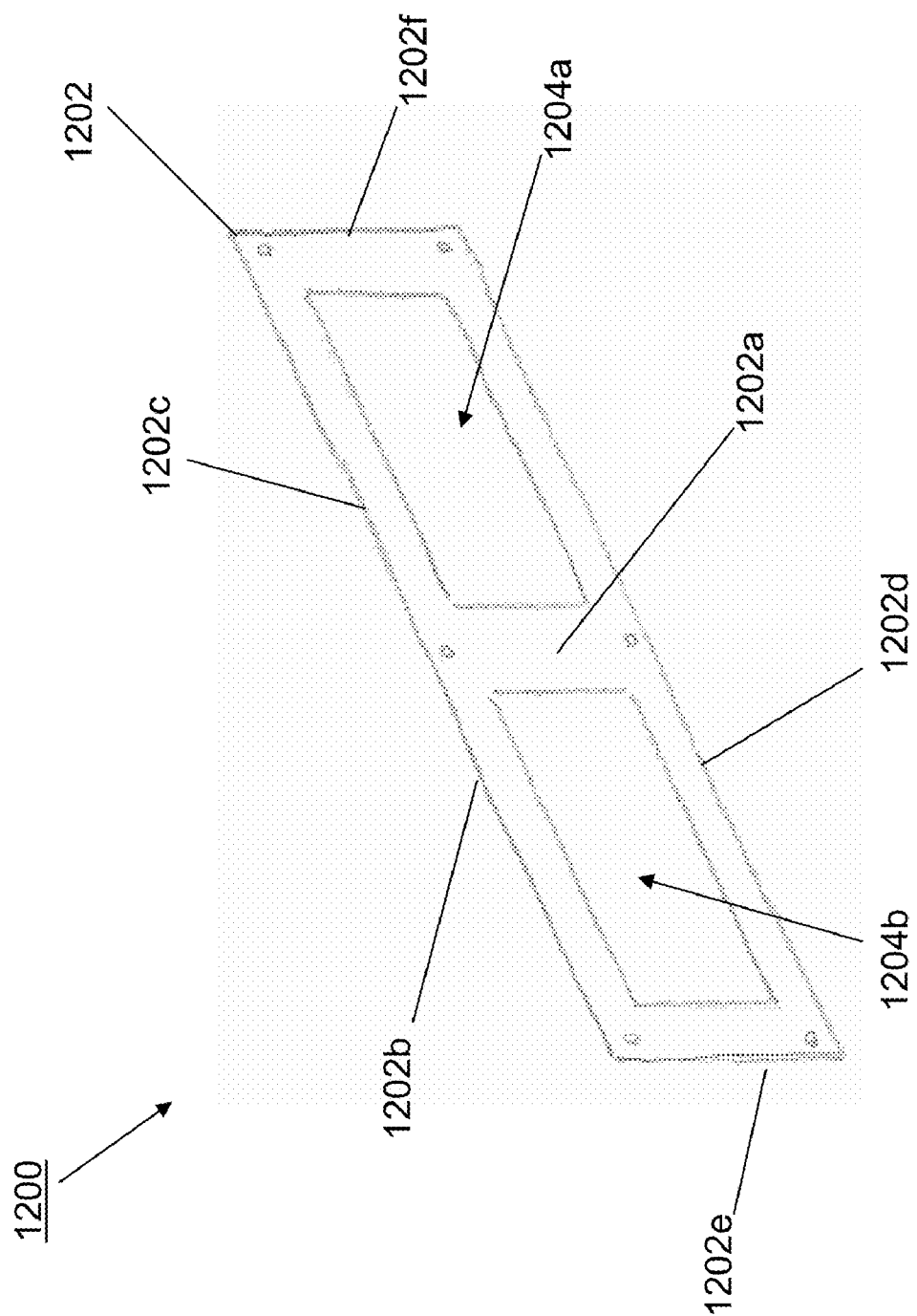
FIG. 12 is a perspective view illustrating an embodiment of a stiffening member used with the board of FIG. 7.

Referring now to FIG. 12, a stiffening member 1200 is illustrated. A stiffening member includes a base 1202 having a front surface 1202a, a rear surface 1202b opposite the front surface 1202a, a top edge 1202c extending between the front surface 1202a and the rear surface 1202b, a bottom surface 1202d located opposite the top surface 1202c and extending between the front surface 1202a and the rear surface 1202b, and a pair of opposing side edges 1202e and 1202f extending between the front surface 1202a, the rear surface 1202b, the top edge 1202c, and the bottom edge 1202d. A pair of passageways 1204a and 1204b are defined by the base 1202 and extend through the base 1202 from the front surface 1202a to the rear surface 1202b.

Figure 13A:
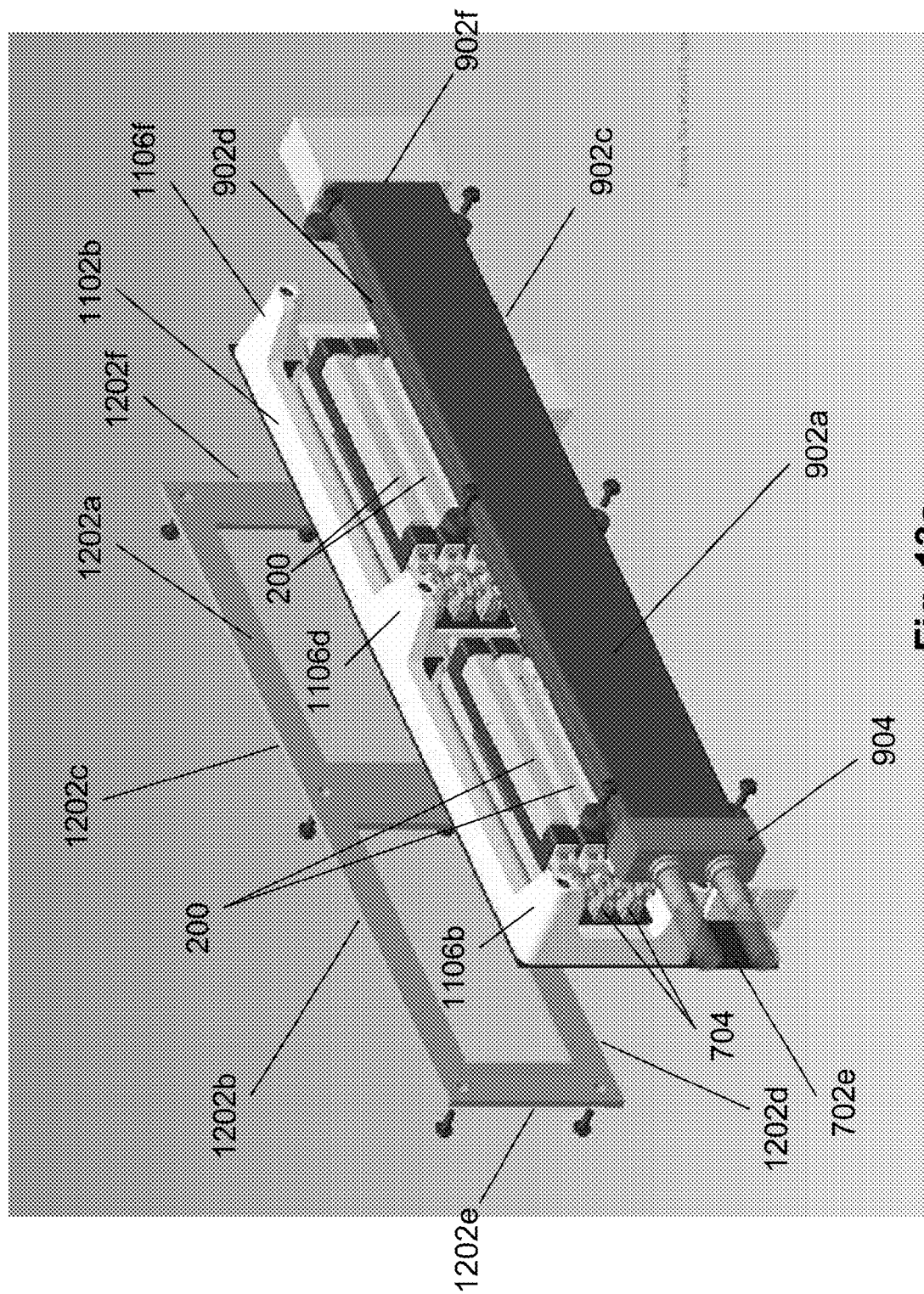
FIG. 13a is an exploded perspective view illustrating an embodiment of the HPC of FIGS. 2a, 2b and 2c and the mounting structure of FIG. 11 coupled to the board of FIG. 7, the stiffening member of FIG. 12 being coupled to the board, and the liquid cooling device of FIG. 9 being coupled to the mounting structure.
Figure 13B:
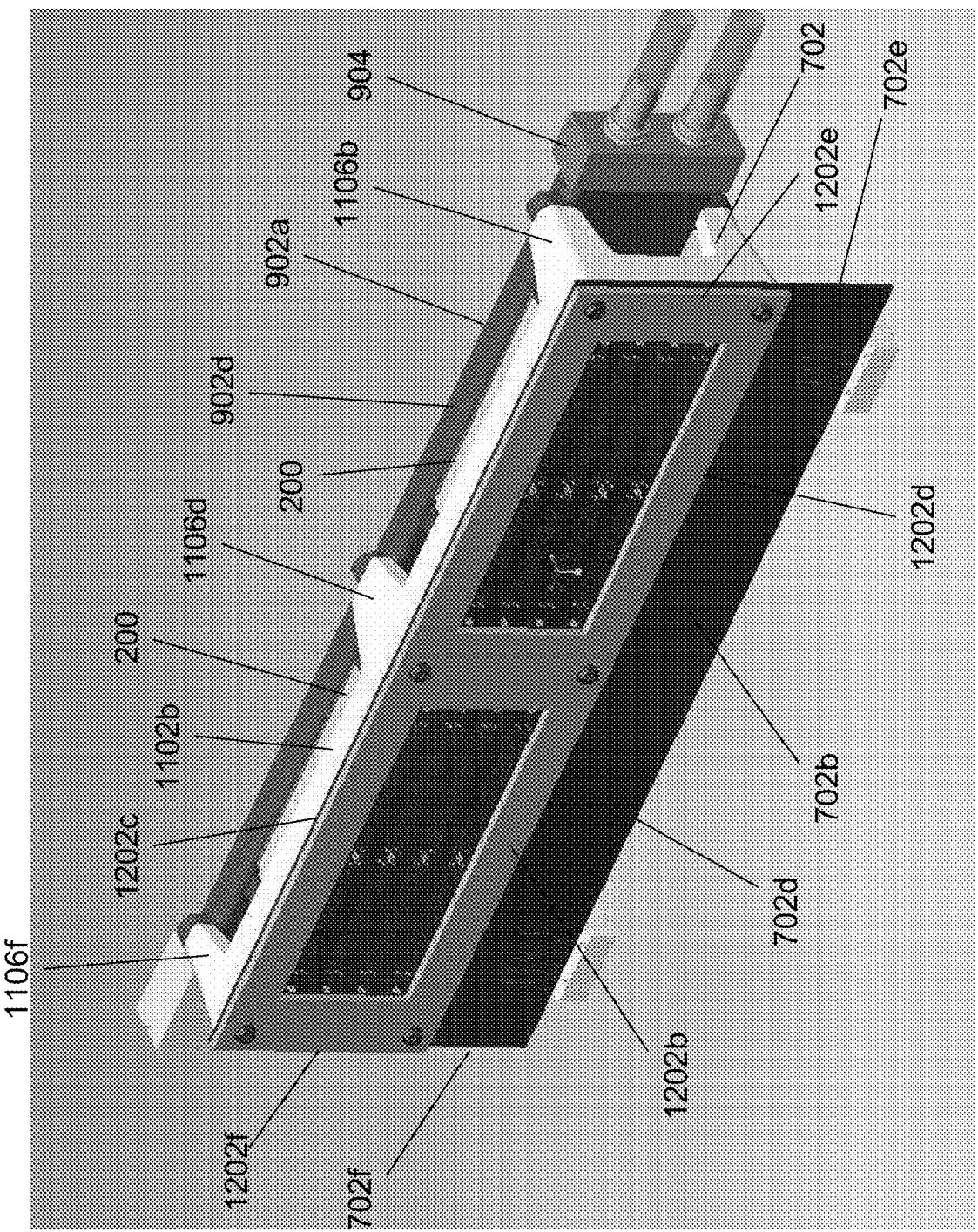

Referring now to FIGS. 2a, 2b, 2c, 7, 9, 11, 12, 13a and 13b, the method 600 may be performed using the HPC 200, the board 700, the liquid cooling device 900, the mounting structure 1100, and the stiffening member 1200. The method 600 begins at block 602 where a board including a plurality of HPCs is provided. In an embodiment, the mounting structure 1100 is coupled to the board 700 using fasteners (e.g., screws, tool less fasteners, and/or a variety of other fasteners known in the art) such that the component couplers 704 are located in the component channel 1104 defined by the mounting structure 1100. A plurality of the HPCs 200 may then be coupled to the board 700 by positioning the bottom edge 202d of a respective HPC 200 in the respective component slot 704a on a component coupler 704 and then securing the HPC 200 to the component coupler 704 using methods known in the art. The stiffening member 1200 may be coupled to the board 700 by positioning the front surface 1202a of the stiffening member 1200 adjacent the bottom surface 702b of the board and using fasteners (e.g., screws, tool less fasteners, and/or a variety of other fasteners known in the art) to secure the stiffening member 1200 to the board 700, as illustrated in FIG. 13b.

The method 600 then proceeds to block 604 where the HPCs are engaged with a liquid cooling device. The liquid cooling device 900 is engaged with the plurality of HPCs 200 by positioning the liquid cooling device 900 adjacent the plurality of HPCs 200 and the mounting structure 1100 such that the liquid cooling device 900 engages the mounting pillars 1106a, 1106b, 1106c, 1106d, 1106e and 1106f and the bottom surface 902b of the liquid cooling device 900 engages the plurality of heat producing components 200. In an embodiment, the liquid cooling device 900 may be secured to the mounting structure 1100 using fasteners (e.g., screws, tool less fasteners, and/or a variety of other fasteners known in the art). With the liquid cooling device 900 secured to the mounting structure 1100, the bottom surface 902b of the liquid cooling device 900 is held in engagement with the plurality of HPCs 200. In an embodiment, a thermal interface material may be located between bottom surface 902b of the liquid cooling device 900 and the HPCs 200 in order to facilitate the transfer of heat from the HPCs 200 to the liquid cooling device 900. The method 600 may then proceed to block 606 where liquid is moved through the liquid cooling device to cool the plurality of HPCs. Conduits such as, for example, flexible tubes may be coupled to the access apertures 904a on the fitting 904 such that liquid may be supplied to through the fitting 904 to the base 902. By moving liquid through the base 902, heat may be transferred from the HPCs 200 to the liquid, and that heated liquid may then leave the base to be replaced by cooler liquid, thereby facilitating heat transfer from the memory devices 202. Furthermore, the system described above allows the liquid cooling device 900 to be decoupled from the mounting structure 800 and disengaged from the plurality of HPCs 200 without the need to disconnect the conduits that supply liquid to the liquid cooling device 900. With the liquid cooling device 900 disengaged from the plurality of HPCs 200, any or all of the HPCs 200 may be quickly and easily removed or replaced with other HPCs 200 and the liquid cooling device 900 may then be re-engaged with the HPCs 200 to again provide cooling. Thus, a system and method are provided that allow a plurality of HPCs to be cooled by a single liquid cooling device that may be removed quickly and easily without the need to remove its liquid supply and such that any or all of the HPCs may be quickly and easily replaced. Furthermore, the use of the single liquid cooling device to cool the plurality of HPCs allows larger conduits to be used to supply liquid to the liquid cooling device while also allowing for larger liquid passageways in the liquid cooling device relative to conventional liquid cooling systems. This reduces the pressure needed to move liquid through the liquid cooling system and allows more heat to transferred relative to conventional liquid cooling systems.

Referring now to FIG. 14, test results from an experimental embodiment 1400 of the system described above is illustrated. The experimental embodiment 1400 illustrates the results of 3 tests in which eight DIMMs were operated while being cooled using an embodiment of the cooling system described above. The temperature of the DRAMs, the power consumed by the DRAMs, the ambient temperature of the test environment, the degrees centigrade per watt (° C./W; a measure of thermal resistance), the fluid temperature, and the degrees centigrade per Watt of the liquid cooling device were measured. The liquid cooling system was used to cool the DIMMs at three different temperatures (42.6 C, 30.7 C, and 25.8 C), and measurements were taken for the previously mentioned variables. As can be seen from FIG. 14, the power consumed by the modules was held nearly constant across the three tests at approximately 19 W. The ambient temperature of the environment for all three test was relatively constant as well, ranging between 22 and 25 degrees Centigrade. As can be seen from the DRAM temperature values, the component liquid cooling system resulted in significantly lower temperatures than could be obtained from convective air cooling or other single point source liquid cooling solutions. Thus, the liquid cooling system provides a lower fluid side pressure drop through the use of a large, efficient liquid cooling device relative to conventional solutions that utilize smaller liquid cooling devices coupled to each HPC. This results in greater efficiency in cooling the HPCs.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component cooling system, comprising:
a board;
a plurality of heat producing components (HPCs) coupled to the board;
a plurality of heat spreaders, each of the plurality of heat spreaders coupled to a corresponding HPC of the plurality of HPCs, wherein the each of the plurality of heat spreaders includes a liquid cooling device engagement surface and the plurality of liquid cooling device engagement surfaces are co-planar;
a mounting structure that is operable to be coupled to the board adjacent to the plurality of HPCs; and
a liquid cooling device including a heat spreader engagement surface, wherein the liquid cooling device is operable to be coupled to the board using the mounting structure such that the heat spreader engagement surface engages each of the co-planar liquid cooling device engagement surfaces on the plurality of heat spreaders while the plurality of heat spreaders are coupled to the plurality of HPCs and the plurality of HPCs are coupled to the board, and wherein the liquid cooling device is operable to be decoupled from the board such that the heat spreader engagement surface disengages each of the co-planar liquid cooling device engagement surfaces on the plurality of heat spreaders while the plurality of heat spreaders remain coupled to the plurality of HPCs and the plurality of HPCs remain coupled to the board.

2. The system of claim 1, further comprising:
a stiffening member mounted to the board opposite the mounting structure.

3. The system of claim 1, further comprising: a plurality of retaining clips, each retaining clip securing the each of the plurality of heat spreaders to the corresponding HPC of the plurality of HPCs.

4. The system of claim 1, further comprising:
at least one fitting located on the liquid cooling device, wherein the at least one fitting is operable to couple a liquid conduit to the liquid cooling device.

5. The system of claim 4, wherein the mounting structure comprises
at least one coupling member that allows the liquid cooling device to decouple from the mounting structure without disconnecting the liquid conduit from the at least one fitting when the liquid conduit is connected to the at least one fitting.

6. The system of claim 5, wherein the decoupling of the liquid cooling device from the mounting structure allows any of the plurality of HPCs to be decoupled from the board.

7. An information handling system (IHS), comprising:
an IHS chassis; a board mounted in the IHS chassis;
a processor mounted to the board;

a plurality of heat producing components (HPCs) coupled to the board and the processor;

a plurality of heat spreaders, each of the plurality of heat spreaders coupled to a corresponding HPC of the plurality of HPCs, wherein the each of the plurality of heat spreaders includes a liquid cooling device engagement surface and the plurality of liquid cooling device engagement surfaces are co-planar;

a mounting structure that is operable to be coupled to the board adjacent to the plurality of HPCs; and a liquid cooling device including a heat spreader engagement surface, wherein the liquid cooling device is operable to be coupled to the board using the mounting structure such that the heat spreader engagement surface engages each of the co-planar liquid cooling device engagement surfaces on the plurality of heat spreaders while the plurality of heat spreaders are coupled to the plurality of HPCs and the plurality of HPCs are coupled to the board, and wherein the liquid cooling device is operable to be decoupled from the board such that the heat spreader engagement surface disengages each of the co-planar liquid cooling device engagement surfaces on the plurality of heat spreaders while the plurality of heat spreaders remain coupled to the plurality of HPCs and the plurality of HPCs remain coupled to the board.

8. The system of claim 7, further comprising:
a stiffening member mounted to the board opposite the mounting structure.

9. The system of claim 7, further comprising: a plurality of retaining clips, each retaining clip securing the each of the plurality of heat spreaders to the corresponding HPC of the plurality of HPCs.

10. The system of claim 7, further comprising:
at least one fitting located on the liquid cooling device, wherein the at least one fitting is operable to couple a liquid conduit to the liquid cooling device.

11. The system of claim 10, further comprising:
at least one coupling member that allows the liquid cooling device to decouple from the mounting structure without disconnecting the liquid conduit from the at least one fitting when the liquid conduit is connected to the at least one fitting.

12. The system of claim 11, wherein the decoupling of the liquid cooling device from the mounting structure allows any of the plurality of HPCs to be decoupled from the board.

13. A method for cooling a plurality of heat producing components (HPCs), comprising:
providing a board comprising the plurality of HPCs coupled to the board, wherein a plurality of heat spreaders, each of the plurality of heat spreaders coupled to a corresponding HPC of the plurality of HPCs, the each of the plurality of heat spreaders includes a liquid cooling device engagement surface, and the plurality of liquid cooling device engagement surfaces are co-planar;

coupling a liquid cooling device that includes a heat spreader engagement surface to the board while the plurality of heat spreaders are coupled to the plurality of HPCs and the plurality of HPCs are coupled to the board such that the heat spreader engagement surface engages each of the co-planar liquid cooling device engagement surfaces on the plurality of heat spreaders;

coupling a mounting structure to the board adjacent to the plurality of HPCs;

coupling the liquid cooling device to the mounting structure such that the heat spreader engagement surface on the liquid cooling device engages each of the co-planar liquid cooling device engagement surfaces on the plurality of heat spreaders;

moving a liquid through the liquid cooling device to cool the plurality of HPCs; and decoupling the liquid cooling device from the board while the plurality of heat spreaders remain coupled to the plurality of HPCs and the plurality of HPCs remain coupled to the board such that the heat spreader engagement surface disengages each of the co-planar liquid cooling device engagement surface on the plurality of heat spreaders.

14. The method of claim 13, further comprising: using a plurality of retaining clips, each retaining clip securing the each of the plurality of heat spreaders to the corresponding HPC of the plurality of HPCs.

15. The method of claim 13, further comprising:
connecting a liquid conduit to at least one fitting located on the liquid cooling device such that the liquid may be moved through the liquid cooling device.

16. The method of claim 15, further comprising: decoupling the liquid cooling device from the mounting structure without disconnecting the liquid conduit from the at least one fitting; and decoupling at least one of the plurality of HPCs from the board.

* * * * *